(12) United States Patent
Sun et al.

(10) Patent No.: US 11,776,990 B2
(45) Date of Patent: Oct. 3, 2023

(54) MICRO LIGHT-EMITTING DIODE DISPLAY PANEL

(71) Applicant: PlayNitride Display Co., Ltd., MiaoLi County (TW)

(72) Inventors: Sheng-Yuan Sun, MiaoLi County (TW); Po-Wei Chiu, MiaoLi County (TW); Loganathan Murugan, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 136 days.

(21) Appl. No.: 17/536,122

(22) Filed: Nov. 29, 2021

(65) Prior Publication Data

US 2022/0336526 A1    Oct. 20, 2022

Related U.S. Application Data

(60) Provisional application No. 63/175,565, filed on Apr. 16, 2021.

(30) Foreign Application Priority Data

Aug. 31, 2021   (TW) .................................. 110132217

(51) Int. Cl.
*H01L 27/15* (2006.01)
*H01L 33/10* (2010.01)
*H01L 33/50* (2010.01)

(52) U.S. Cl.
CPC ............ *H01L 27/156* (2013.01); *H01L 33/10* (2013.01); *H01L 33/505* (2013.01)

(58) Field of Classification Search
CPC ...... H01L 33/10; H01L 33/505; H01L 27/156
See application file for complete search history.

(56) References Cited

U.S. PATENT DOCUMENTS 10,170,671 B2 *  1/2019  Chu .................... H01L 25/0753
10,410,998 B2 *  9/2019  Kim .................... H01L 25/0753
(Continued)

FOREIGN PATENT DOCUMENTS

| CN | 111370547 | 7/2020 |
| TW | 201942671 | 11/2019 |
| TW | 202046506 | 12/2020 |

OTHER PUBLICATIONS

"Office Action of Taiwan Counterpart Application", dated Apr. 27, 2022, p. 1-p. 7.

*Primary Examiner* — Mark W Tornow
(74) *Attorney, Agent, or Firm* — JCIPRNET

(57) ABSTRACT

A micro light-emitting diode display panel including first and second substrates, micro light-emitting diodes, a wavelength conversion layer, a light-shielding pattern layer, a light filter layer, and an air gap is provided. The micro light-emitting diodes are disposed on the first substrate and respectively located in a plurality of sub-pixel areas. The micro light-emitting diodes are adapted to emit a light beam. The wavelength conversion layer is overlapped with at least a portion of the micro light-emitting diodes. The light beam is used to excite the wavelength conversion layer to emit a converted light beam. The light filter layer is disposed between the wavelength conversion layer and the second substrate and overlapped with the micro light-emitting diodes. The air gap is disposed between any two adjacent ones of any one of the micro light-emitting diodes, the second substrate, the wavelength conversion layer, and the light filter layer.

17 Claims, 20 Drawing Sheets

(56) References Cited

U.S. PATENT DOCUMENTS

2015/0340346 A1\* 11/2015 Chu ................. H01L 33/50
257/89
2020/0381599 A1\* 12/2020 Kuo ................. H01L 33/56

\* cited by examiner

MICRO LIGHT-EMITTING DIODE DISPLAY PANEL

CROSS-REFERENCE TO RELATED APPLICATION

This application claims the priority benefits of U.S. provisional application Ser. No. 63/175,565, filed on Apr. 16, 2021, and Taiwan application serial no. 110132217, filed on Aug. 31, 2021. The entirety of each of the above-mentioned patent applications is hereby incorporated by reference herein.

BACKGROUND OF THE INVENTION

Field of the Invention

The invention relates to a display panel, and particularly relates to a micro light-emitting diode display panel.

Description of Related Art

In recent years, the manufacturing cost of an organic light-emitting diode (OLED) display panel has been high and the service life thereof may not compete with current mainstream displays, and therefore micro light-emitting diode displays (micro LED displays) have gradually attracted investment from various technology companies. In particular, micro light-emitting diode displays not only have optical performance equivalent to that of the organic light-emitting diode display, such as high color saturation, fast response speed, and high contrast, but also have the advantages of low energy consumption and long material life. Therefore, micro light-emitting diode displays are expected to become the mainstream display technique of the next generation.

In general, the manufacturing technique of micro light-emitting diode displays adopts the method of die transposition to directly transfer pre-made micro light-emitting diode dies to the driving circuit backplane. Moreover, a transparent cover plate is disposed above the transposed dies to prevent the dies from being damaged by the impact of external forces. However, the configuration of the transparent cover plate increases the reflectivity of micro light-emitting diode displays to external ambient light, resulting in a decrease in display contrast. Therefore, another technique of filling the encapsulation layer between the transparent cover plate and the dies is proposed. However, the encapsulation layer reduces the light output efficiency of micro light-emitting diode displays.

SUMMARY OF THE INVENTION

The invention provides a micro light-emitting diode display panel having better light output efficiency and display contrast.

A micro light-emitting diode display panel of the invention includes a first substrate, a second substrate, a plurality of micro light-emitting diodes, a wavelength conversion layer, a light-shielding pattern layer, a light filter layer, and an air gap. The second substrate is disposed opposite to the first substrate. The micro light-emitting diodes are disposed on the first substrate and respectively located in a plurality of sub-pixel areas. The micro light-emitting diodes are adapted to emit a light beam. The wavelength conversion layer is overlapped with at least a portion of the micro light-emitting diodes, and is located between at least a portion of the micro light-emitting diodes and the second substrate. The light beam is used to excite the wavelength conversion layer to emit a converted light beam. The light-shielding pattern layer is disposed on the second substrate and has a plurality of first openings defining the sub-pixel areas. The light filter layer is disposed between the wavelength conversion layer and the second substrate and overlapped with the micro light-emitting diodes. The air gap is disposed between any two adjacent ones of any one of the micro light-emitting diodes, the second substrate, the wavelength conversion layer, and the light filter layer.

In an embodiment of the invention, a portion of the air gap of the micro light-emitting diode display panel located in a portion of the sub-pixel areas has a first height, another portion of the air gap located at another portion of the sub-pixel areas has a second height, and the first height is different from the second height.

In an embodiment of the invention, the wavelength conversion layer of the micro light-emitting diode display panel is disposed on the first substrate, and the air gap is located between the wavelength conversion layer and the light filter layer.

In an embodiment of the invention, the micro light-emitting diode display panel further includes a dichroic filter overlapped with at least a portion of the plurality of micro light-emitting diodes. The dichroic filter is adapted to reflect one of the light beam and the converted light beam and allow the other one of the light beam and the converted light beam to pass through.

In an embodiment of the invention, the wavelength conversion layer of the micro light-emitting diode display panel has a plurality of wavelength conversion patterns overlapped with the plurality of micro light-emitting diodes, and a surface profile of each of the wavelength conversion patterns defining the air gap is arc-shaped.

In an embodiment of the invention, the wavelength conversion layer of the micro light-emitting diode display panel is disposed on the second substrate, and the air gap is located between the wavelength conversion layer and the plurality of micro light-emitting diodes.

In an embodiment of the invention, the light filter layer of the micro light-emitting diode display panel is disposed on the first substrate, and the air gap is located between the second substrate and the light filter layer.

In an embodiment of the invention, the air gap of the micro light-emitting diode display panel comprises a first sub-gap layer and a second sub-gap layer. The first sub-gap layer is disposed between the light filter layer and the wavelength conversion layer, and the second sub-gap layer is disposed between the wavelength conversion layer and the plurality of micro light-emitting diodes.

In an embodiment of the invention, the micro light-emitting diode display panel further includes an isolation layer disposed on the first substrate and having a plurality of second openings overlapped with the plurality of first openings of the light-shielding pattern layer. The wavelength conversion layer is disposed in at least a portion of the second openings. The light filter layer is disposed in the first openings.

In an embodiment of the invention, one of the isolation layer and the light-shielding pattern layer of the micro light-emitting diode display panel extends in the air gap and contacts the other one of the isolation layer and the light-shielding pattern layer.

In an embodiment of the invention, the micro light-emitting diode display panel further includes a reflective layer disposed between the plurality of micro light-emitting diodes and located between the isolation layer and the first substrate.

In an embodiment of the invention, a height of the air gap of the micro light-emitting diode display panel is less than an arrangement pitch of the plurality of micro light-emitting diodes on the first substrate.

In an embodiment of the invention, the micro light-emitting diode display panel further includes an optical adhesive layer disposed between the first substrate and the second substrate and connected to at least a portion of the plurality of micro light-emitting diodes, the wavelength conversion layer, and the light filter layer. The air gap is a plurality of microbubbles, and the microbubbles are dispersedly disposed in the optical adhesive layer.

In an embodiment of the invention, an orthographic projection area of each of the microbubbles of the micro light-emitting diode display panel on the first substrate is less than an orthographic projection area of each of the micro light-emitting diodes on the first substrate.

In an embodiment of the invention, a surface of the wavelength conversion layer of the micro light-emitting diode display panel facing the plurality of micro light-emitting diodes is provided with a plurality of optical microstructures, and the surface of the wavelength conversion layer and a light-emitting surface of the micro light-emitting diodes define the air gap.

In an embodiment of the invention, a light-emitting surface of each of the micro light-emitting diodes of the micro light-emitting diode display panel facing the light filter layer is provided with a plurality of optical microstructures, and the air gap is located between the optical microstructures and the wavelength conversion layer.

In an embodiment of the invention, the micro light-emitting diode display panel further includes a cladding layer. The cladding layer covers the micro light-emitting diodes and has a plurality of grooves. The grooves are overlapped with the micro light-emitting diodes respectively. The wavelength conversion layer is disposed in a portion of the grooves and connects a portion of the micro light-emitting diodes and the cladding layer. A surface of another portion of the grooves and a light-emitting surface of another portion of the micro light-emitting diodes define the air gap.

Based on the above, in the micro light-emitting diode display panel of an embodiment of the invention, a plurality of micro light-emitting diodes, a light-shielding pattern layer, a wavelength conversion layer, and a light filter layer are provided between the first substrate and the second substrate. By disposing an air gap between any two adjacent ones of the micro light-emitting diodes, the wavelength conversion layer, the light filter layer, and the light-shielding pattern layer, the light output efficiency of the micro light-emitting diode display panel may be effectively increased. Moreover, the light-shielding pattern layer on the second substrate may also reduce the reflectivity of the micro light-emitting diode display panel to external ambient light, so as to increase the display contrast of the micro light-emitting diode display panel.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
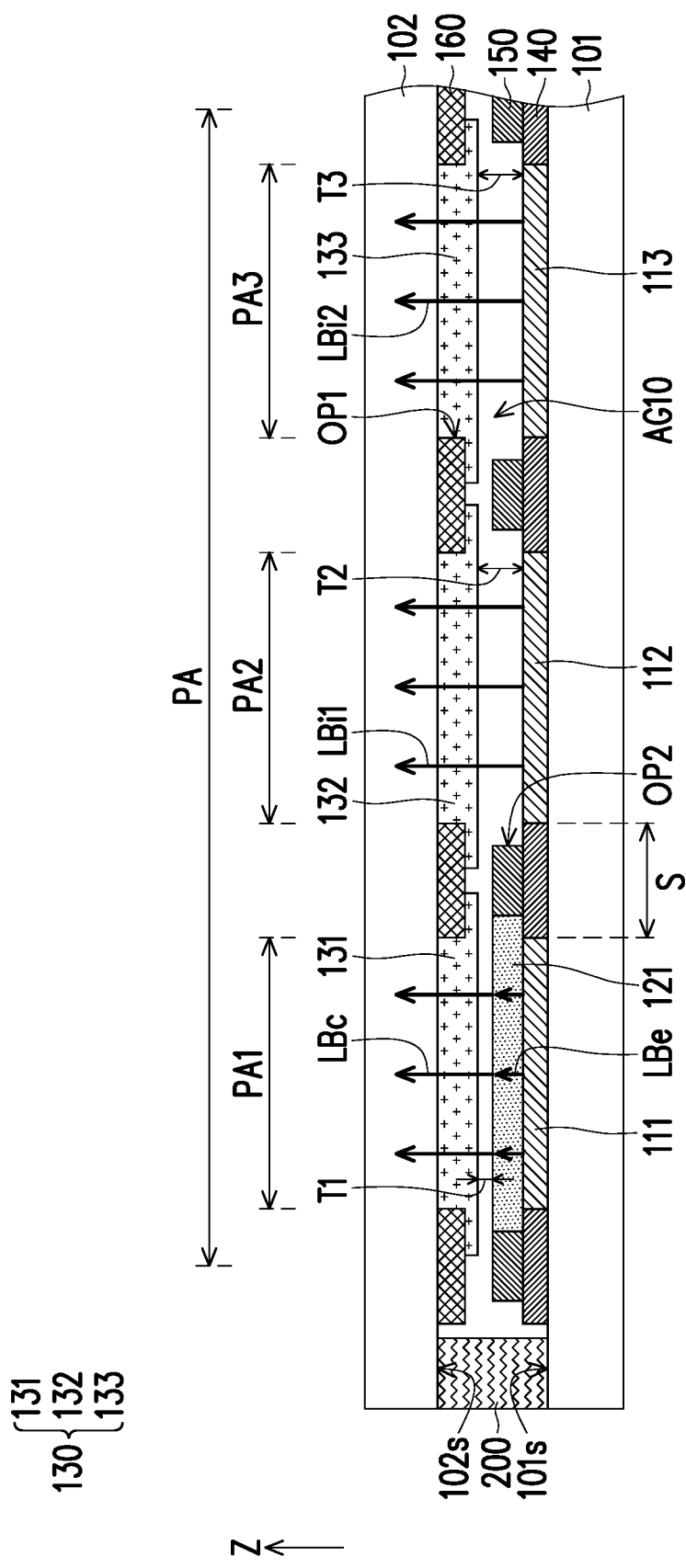
FIG. 1 is a schematic cross-sectional view of a micro light-emitting diode display panel of the first embodiment of the invention.

In the figures, for clarity, the thicknesses or heights of, for example, layers, films, panels, and areas are enlarged. It should be understood that, when a layer, film, area, or a device of a substrate is "on" another device or "connected to" another device, the device may be directly on the other device or connected to the other device, or an intermediate device may also be present. On the other hand, when a device is "directly on another device" or "directly connected to" another device, an intermediate device is not present. As used in the present specification, "connected to" may refer to a physical and/or electrical connection. Furthermore, "electrically connected" may mean that other devices are present between two devices.

Hereinafter, exemplary embodiments of the invention are described in detail, and examples of the exemplary embodiments are conveyed via the figures. Wherever possible, the same reference numerals are used in the figures and the descriptions to refer to the same or similar portions.

FIG. 1 is a schematic cross-sectional view of a micro light-emitting diode display panel of the first embodiment of the invention. Referring to FIG. 1, a micro light-emitting diode display panel 10 includes a first substrate 101, a second substrate 102, a plurality of micro light-emitting diodes, and a light-shielding pattern layer 160. The micro light-emitting diodes are disposed on a substrate surface 101$s$ of the first substrate 101 and include a plurality of micro light-emitting diodes 111, a plurality of micro light-emitting diodes 112, and a plurality of micro light-emitting diodes 113. For example, in the present embodiment, the micro light-emitting diodes may be flip-chip type micro light-emitting diodes or vertical type micro light-emitting diodes.

In the present embodiment, the first substrate 101 is, for example, a display circuit substrate. That is, the first substrate 101 may include a plurality of signal lines (such as scan lines, data lines, and power lines), a plurality of pixel structures (such as a combination of at least two active devices and at least one capacitor), and a plurality of bonding pads, which are not shown, for controlling the display of the micro light-emitting diode display panel 10, but is not limited thereto. The micro light-emitting diodes are electrically bonded to the bonding pads to be electrically connected to the first substrate 101. The light-shielding pattern layer 160 is disposed on the second substrate 102 and has a plurality of first openings OP1. The material of the light-shielding pattern layer 160 may include black resin or other suitable light-absorbing materials.

In particular, the micro light-emitting diode display panel 10 has a plurality of display pixel areas PA, and each of the pixel areas includes a plurality of sub-pixel areas PA1, PA2, PA3. In particular, the first openings OP1 of the light-shielding pattern layer 160 may define a plurality of sub-pixel areas of the micro light-emitting diode display panel 10, for example, the sub-pixel areas PA1, the sub-pixel areas PA2, and the sub-pixel areas PA3 arranged alternately. The micro light-emitting diodes 111, the micro light-emitting diodes 112, and the micro light-emitting diodes 113 are respectively located in the sub-pixel areas PA1, the sub-pixel areas PA2, and the sub-pixel areas PA3. In order to increase the light output efficiency of the micro light-emitting diodes, a reflective layer 140 may be further provided between any two adjacent ones of the micro light-emitting diodes. The material of the reflective layer 140 may include a white resin material, a Bragg reflector, or other materials with high reflectivity.

For example, in the present embodiment, the sub-pixel areas PA1, the sub-pixel areas PA2, and the sub-pixel areas PA3 may be used to display red, green, and blue, respectively. It should be noted that, in the present embodiment, the luminous color of the micro light-emitting diodes 111 disposed in the sub-pixel areas PA1 for displaying red is blue, the luminous color of the micro light-emitting diodes 112 disposed in the sub-pixel areas PA2 for displaying green is green, and the luminous color of the micro light-emitting diodes 113 disposed in the sub-pixel areas PA3 for displaying blue is blue.

In other words, the luminous wavelength of the micro light-emitting diodes 111 is different from the luminous wavelength of the micro light-emitting diodes 112 and is the same as the luminous wavelength of the micro light-emitting diodes 113. Therefore, in order to convert the color of the light beam emitted by the micro light-emitting diodes 111 from blue to red, the micro light-emitting diode display panel 10 is further provided with a wavelength conversion layer in an area overlapped with the plurality of micro light-emitting diodes 111 (that is, the sub-pixel areas PA1), and the wavelength conversion layer is located between the micro light-emitting diodes 111 and the second substrate 102.

In detail, the wavelength conversion layer has a plurality of wavelength conversion patterns 121. The wavelength conversion patterns 121 are overlapped with at the plurality of micro light-emitting diodes 111, and are not overlapped with the plurality of micro light-emitting diodes 112 and the plurality of micro light-emitting diodes 113. Here, whether two members are overlapped or not refers to whether the two members have an overlapping relationship along the normal direction (for example, direction Z) of the substrate surface 101$s$ of the first substrate 101. Unless otherwise specified, the overlapping terms appearing in the following content refer to the overlapping relationship of the two members in the direction Z, and are therefore not repeated herein.

A light beam LBe emitted by the micro light-emitting diodes 111 may be used to excite the wavelength conversion patterns 121 of the wavelength conversion layer to emit a converted light beam LBc with a different wavelength. For example, the wavelength conversion patterns 121 are adapted to convert the light beam LBe having a blue light wavelength into the converted light beam LBc having a red light wavelength (i.e., the light beam emitted from the sub-pixel areas PA1). Moreover, since the luminous colors of the micro light-emitting diodes 112 and the micro light-emitting diodes 113 are respectively green and blue, the light beams emitted by the micro light-emitting diodes 112 and the micro light-emitting diodes 113 may be directly used as emission light beams, for example: a green light beam LBi1 and a blue light beam LBi2.

In order to increase the conversion efficiency of the light beam LBe in the wavelength conversion patterns 121 and the light output efficiency of the light beam, an isolation layer 150 may be provided between any two adjacent sub-pixel areas (or micro light-emitting diodes). In the present embodiment, the isolation layer 150 may optionally be disposed on the first substrate 101 and has a plurality of second openings OP2. The plurality of wavelength conversion patterns 121 of the wavelength conversion layer are respectively disposed in a portion of the second openings OP2 overlapped with the plurality of micro light-emitting diodes 111. The material of the isolation layer 150 may include a reflective material (for example, a white resin, a Bragg reflector, or other materials with high reflectivity) or a light-absorbing material (for example, a black resin). The isolation layer 150 and the reflective layer 140 may be selected from the same material, for example, a white resin with high reflectivity, to increase process yield and throughput.

Furthermore, the micro light-emitting diode display panel 10 further includes a light filter layer 130 overlapped with a plurality of micro light-emitting diodes. The light filter layer 130 may optionally be disposed between the wavelength conversion layer and the second substrate 102. In the present embodiment, the light filter layer 130 may include a plurality of first light filter patterns 131, a plurality of second light filter patterns 132, and a plurality of third light filter patterns 133, and the light filter patterns 131-132 and 133 are respectively disposed in the plurality of first openings OP1 of the light-shielding pattern layer 160. More specifically, the first light filter patterns 131, the second light filter patterns 132, and the third light filter patterns 133 are disposed on a substrate surface 102s of the second substrate 102 facing the first substrate 101, and overlapped with the micro light-emitting diodes 111, the micro light-emitting diodes 112, and the micro light-emitting diodes 113, respectively.

In the present embodiment, the converted light beam LBc in the sub-pixel areas PA1, the light beam LBi1 in the sub-pixel areas PA2, and the light beam LBi2 in the sub-pixel areas PA3 are projected onto the retina of the viewer and form an image screen (i.e., display screen) after respectively passing through the first light filter patterns 131, the second light filter patterns 132, and the third light filter patterns 133, thus achieving the effect of color display. Via the configuration of the light filter patterns, the luminous color purity of each of the sub-pixel areas may be increased, and thus the color gamut performance of the micro light-emitting diode display panel 10 may be improved.

It should be noted that, an air gap AG10 is provided between the light filter layer 130 (i.e., a plurality of light filter patterns 131-132 and 133) and the wavelength conversion layer (i.e., the plurality of wavelength conversion patterns 121), and this air gap AG10 also exists in the sub-pixel areas PA2 and the sub-pixel areas PA3. However, the invention is not limited thereto. In particular, the air gap AG10 may be in a general air or vacuum state, and at least a portion of the air gap AG10 may also be filled with a gas with a low refractive index, such as oxygen, nitrogen, or carbon dioxide, etc. with a refractive index greater than or equal to 1 and less than or equal to the refractive index of the micro light-emitting diodes to increase light output efficiency. In other embodiments, the air gap may be disposed between the micro light-emitting diodes and the wavelength conversion layer, or between the light filter layer 130 and the light-shielding pattern layer 160 according to actual product design or manufacturing process requirements. In the present embodiment, a support structure 200 is provided between the first substrate 101 and the second substrate 102 at the edge area of the substrate, and the support structure 200 is connected to the substrate surface 101s of the first substrate 101 and the substrate surface 102s of the second substrate 102 to form the air gap AG10. The material of the support structure 200 is a transmissive high-molecular-weight polymer, for example, polycarbonate, polyimide, polyethylene terephthalate, or epoxy. Preferably, the Young's modulus of the support structure 200 is less than the Young's modulus of the first substrate 101 and the second substrate 102 to provide better bonding cushioning.

It should be mentioned that, the second substrate 102, for example, is a glass substrate, a sapphire substrate, or other flat substrates. Accordingly, the yield of the light filter patterns and the light-shielding pattern layer 160 may be improved and the risk of damaging the micro light-emitting diodes due to an unexpected external force may be reduced. The configuration of the air gap AG10 may prevent the luminous intensity of the micro light-emitting diodes from being lost due to the encapsulation layer filled between the two substrates. In other words, the micro light-emitting diode display panel 10 provided with the air gap AG10 has better light output efficiency than a conventional micro light-emitting diode display panel provided with an encapsulation layer.

In the present embodiment, the air gap AG10 may have different heights in different sub-pixel areas, but is not limited thereto. For example, a height T1 of a portion of the air gap AG10 disposed in the sub-pixel areas PA1 may be less than a height T2 of another portion of the air gap AG10 disposed in the sub-pixel areas PA2 and a height T3 of still another portion of the air gap AG10 disposed in the sub-pixel areas PA3. Accordingly, the conversion efficiency of the light beam LBe when the wavelength conversion layer is excited to form the converted light beam LBc with a longer wavelength may be increased, but is not limited thereto. It should be noted that the height here refers to the height of the air gap AG10 in a direction perpendicular to the substrate surface 101s (for example, direction Z). Unless otherwise specified, the heights appearing in the following content all refer to the heights of the members in direction Z, and are therefore not repeated herein. Moreover, in order to avoid crosstalk between the light beams of adjacent sub-pixel areas, the height T1, the height T2, and the height T3 of the air gap AG10 may be less than an arrangement pitch S of the plurality of micro light-emitting diodes on the first substrate 101, but is not limited thereto. In a preferred embodiment, the height of the air gap AG10 in the direction perpendicular to the first substrate 101 (for example, direction Z) is less than or equal to 100 μm, but is not limited thereto.

It should be mentioned that, since a light filter layer 130 and the light-shielding pattern layer 160 are disposed on the substrate surface 102s of the second substrate 102, the reflectivity of the external ambient light at the second substrate 102 may be reduced, so as to improve the display contrast of the micro light-emitting diode display panel 10.

In the following, other embodiments are provided to explain the disclosure in detail. The same members are labeled with the same reference numerals, and the description of the same technical content is omitted. For the omitted parts, please refer to the above embodiment, which is not repeated herein.

Figure 2:
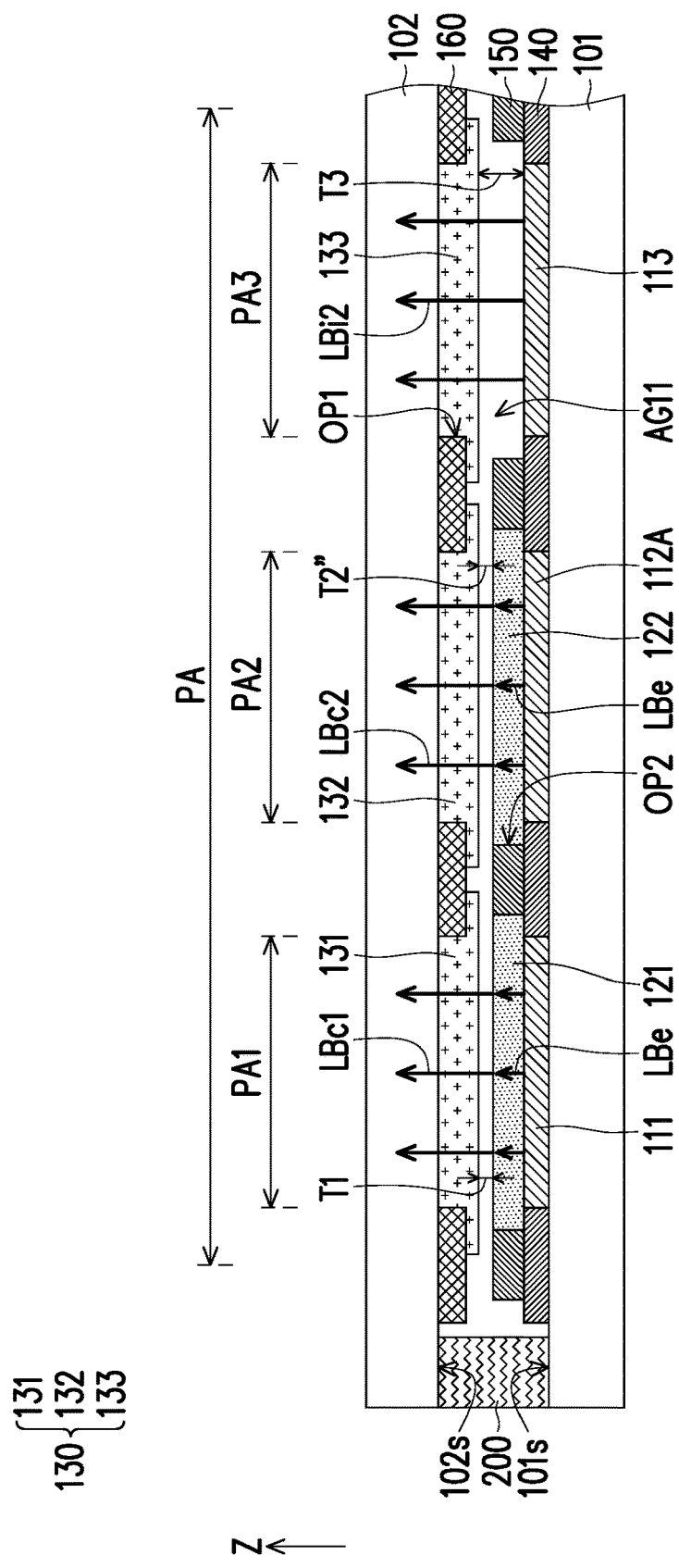
FIG. 2 is a schematic cross-sectional view of a micro light-emitting diode display panel of the second embodiment of the invention.
Figure 3:
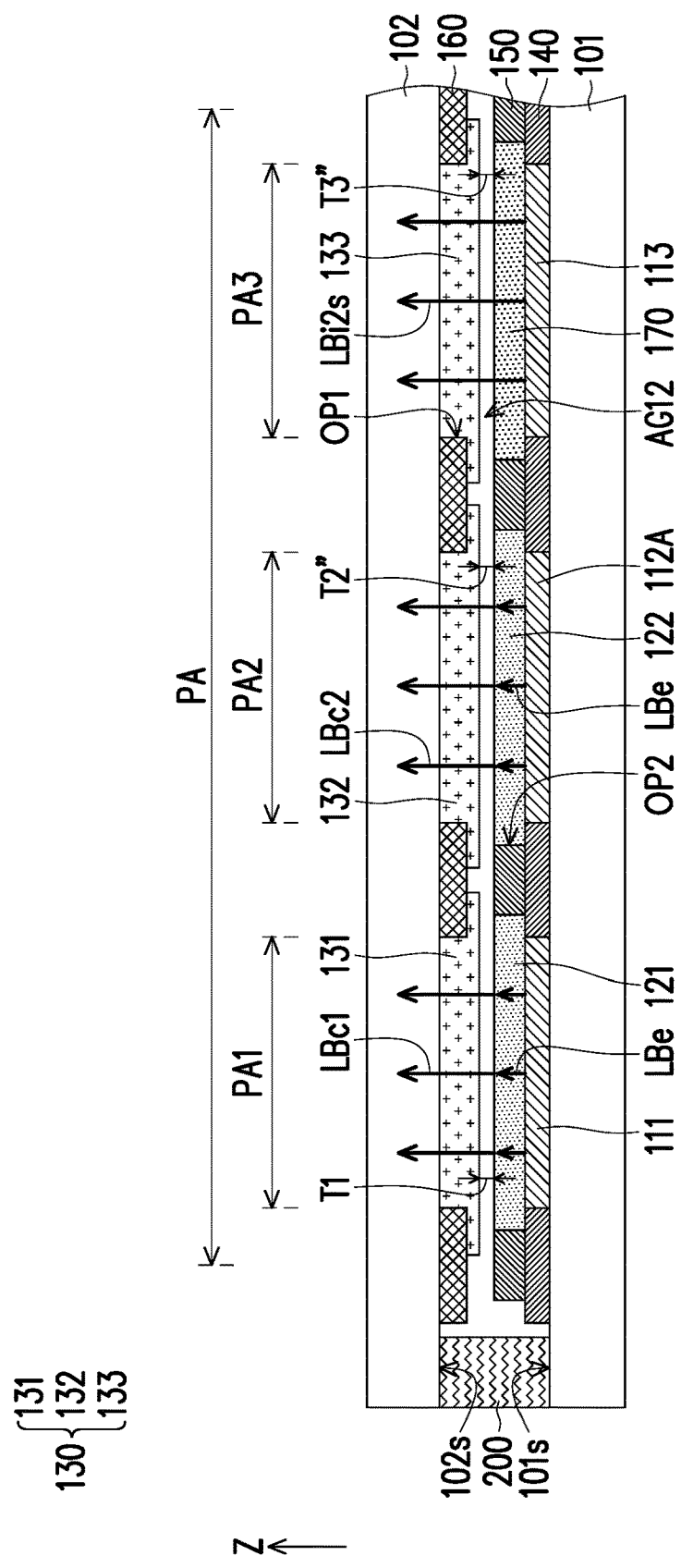
FIG. 3 is a schematic cross-sectional view of another modified embodiment of the micro light-emitting diode display panel of FIG. 2.

FIG. 2 is a schematic cross-sectional view of a micro light-emitting diode display panel of the second embodiment of the invention. FIG. 3 is a schematic cross-sectional view of another modified embodiment of the micro light-emitting diode display panel of FIG. 2. Referring to FIG. 2, the difference between a micro light-emitting diode display panel 10A of the present embodiment and the micro light-emitting diode display panel 10 of FIG. 1 lies in that the wavelength conversion layer and a portion of the micro light-emitting diodes are arranged differently. Specifically, the luminous colors (or luminous wavelengths) of the micro light-emitting diodes 111, micro light-emitting diodes 112A, and the micro light-emitting diodes 113 of the micro light-emitting diode display panel 10A may optionally be the same, for example, they all emit blue light.

Moreover, the wavelength conversion layer of the present embodiment further includes a plurality of wavelength conversion patterns 122 overlapped with the plurality of micro light-emitting diodes 112A. The light beam (i.e., the light beam LBe) emitted by the micro light-emitting diodes 111 and the micro light-emitting diodes 112A may be used to excite the wavelength conversion patterns 121 and the wavelength conversion patterns 122 of the wavelength conversion layer to emit a converted light beam LBc1 and a converted light beam LBc2 with different wavelengths. For example, the converted light beam LBc1 and the converted light beam LBc2 may be red light and green light respectively, but are not limited thereto.

Since in the present embodiment, the wavelength conversion patterns 122 are further provided between the light filter patterns 132 and the micro light-emitting diodes 112A, a height T2" of an air gap AG11 in the sub-pixel areas PA2 and the height T1 of the air gap AG11 in the sub-pixel areas PA1 may optionally be the same, and both are less than the height T3 of the air gap AG11 at the sub-pixel areas PA3, but are not limited thereto. As shown in FIG. 3, for example, the micro light-emitting diode display panel 10B may also optionally include a light scattering layer 170. The light scattering layer 170 may be a plurality of light scattering patterns separated from each other. The light-scattering patterns are respectively overlapped with the plurality of micro light-emitting diodes 113, and are located between the light filter layer 130 (or the light filter patterns 133) and the micro light-emitting diodes 113 to increase the viewing angle range and the light output efficiency of the light beam LBi2s from the micro light-emitting diodes 113.

Moreover, since the light-scattering layer 170 is further disposed between the light filter patterns 133 and the micro light-emitting diodes 113 of the present embodiment, a height T3" of an air gap AG12 in the sub-pixel areas PA3, the height T1 of the air gap AG12 in the sub-pixel areas PA1, and the height T2" of the air gap AG12 in the sub-pixel areas PA2 may optionally be the same, so as to transmit the light beams LBe and the light beam LBi2s from the micro light-emitting diodes into the air gap AG12 through the same flat surface. Hence, the display quality may be improved.

Figure 4:
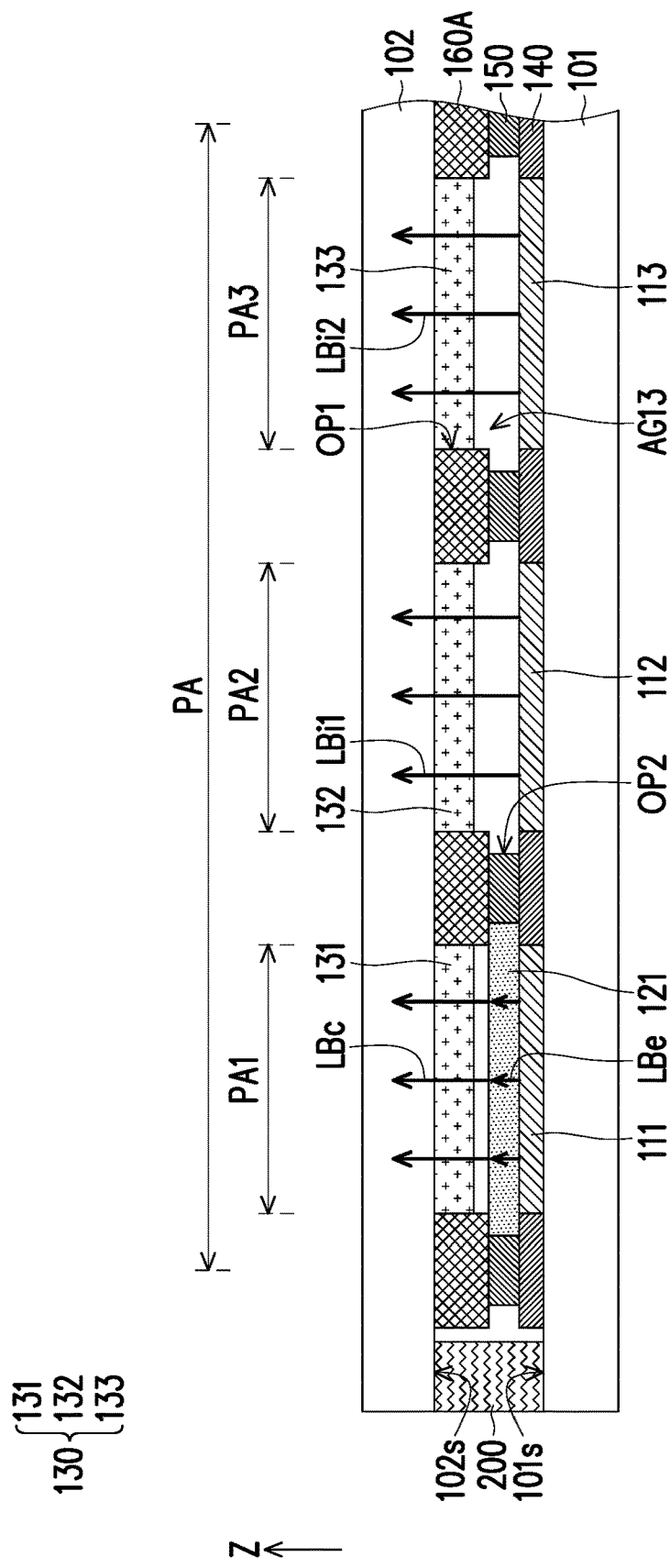
FIG. 4 is a schematic cross-sectional view of a micro light-emitting diode display panel of the third embodiment of the invention.
Figure 5:
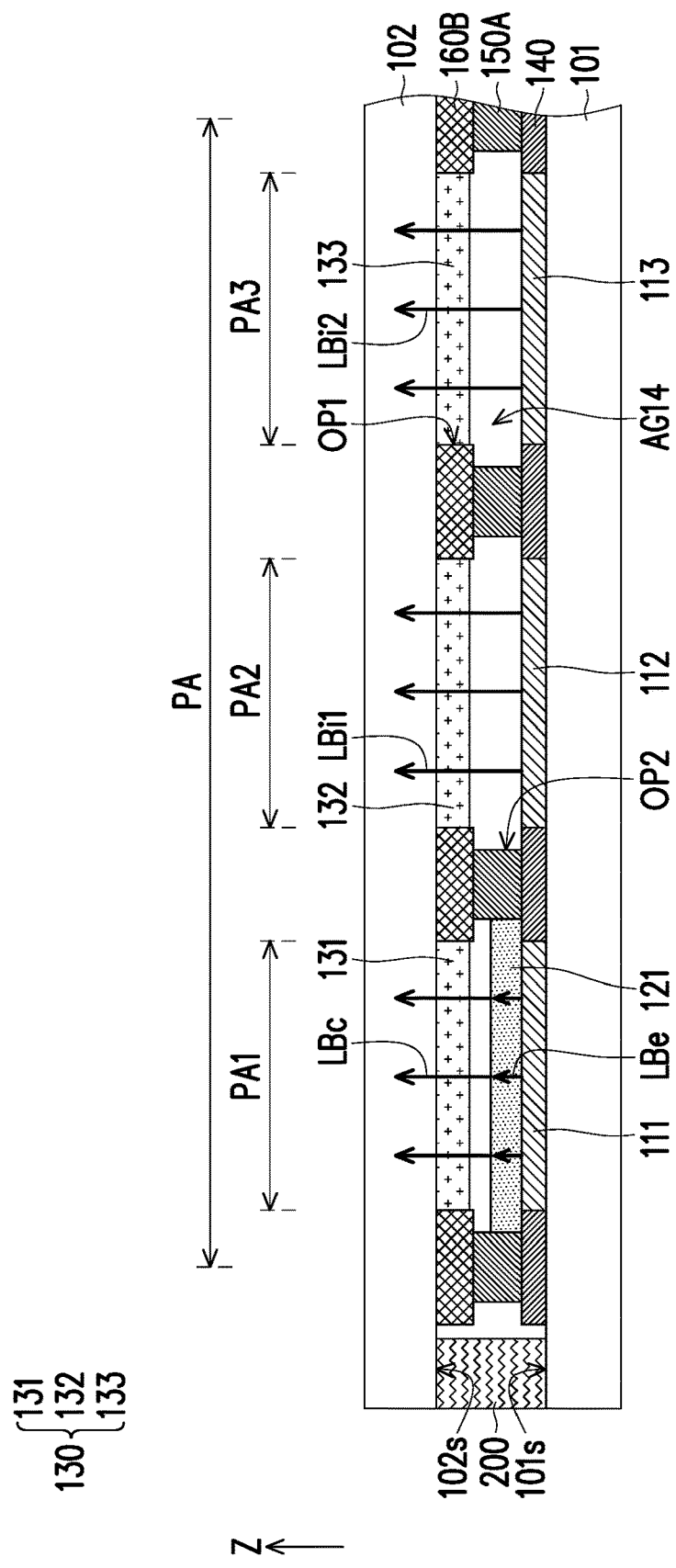
FIG. 5 is a schematic cross-sectional view of a micro light-emitting diode display panel of the fourth embodiment of the invention.

FIG. 4 is a schematic cross-sectional view of a micro light-emitting diode display panel of the third embodiment of the invention. FIG. 5 is a schematic cross-sectional view of a micro light-emitting diode display panel of the fourth embodiment of the invention. Referring to FIG. 4, the difference between a micro light-emitting diode display panel 10C of the present embodiment and the micro light-emitting diode display panel 10 of FIG. 1 lies in that the configuration of the light-shielding pattern layer is different. Specifically, a light-shielding pattern layer 160A of the micro light-emitting diode display panel 10C is extended from the substrate surface 102s of the second substrate 102 in an air gap AG13 and in contact with the isolation layer 150. Accordingly, crosstalk between the light beams of adjacent sub-pixel areas may be avoided, so as to further improve the display quality of the micro light-emitting diode display panel 10C.

However, the invention is not limited thereto. In other embodiments, an isolation layer 150A of a micro light-emitting diode display panel 10D may also extend from the first substrate 101 toward the second substrate 102 into an air gap AG14 and contact a light-shielding pattern layer 160B on the second substrate 102, as shown in FIG. 5.

Figure 6:
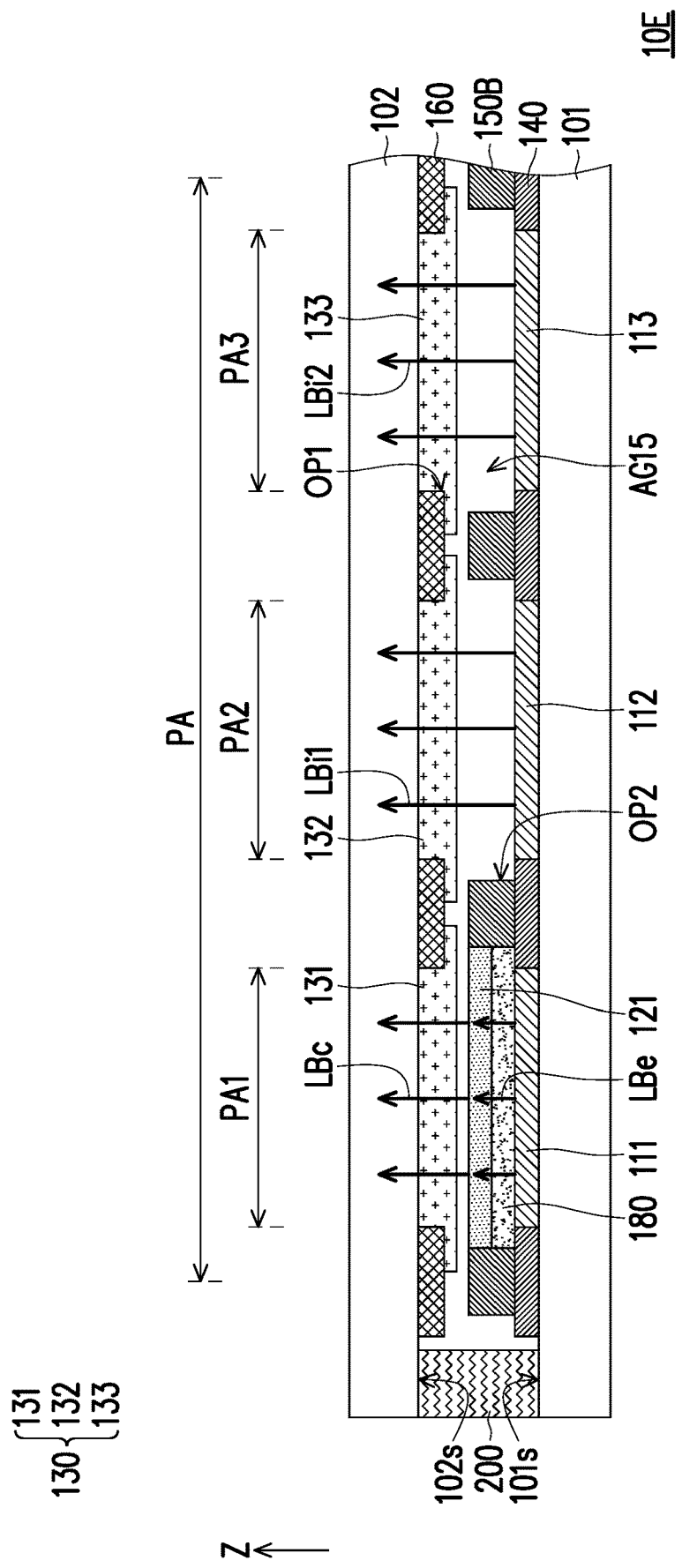
FIG. 6 is a schematic cross-sectional view of a micro light-emitting diode display panel of the fifth embodiment of the invention.
Figure 7:
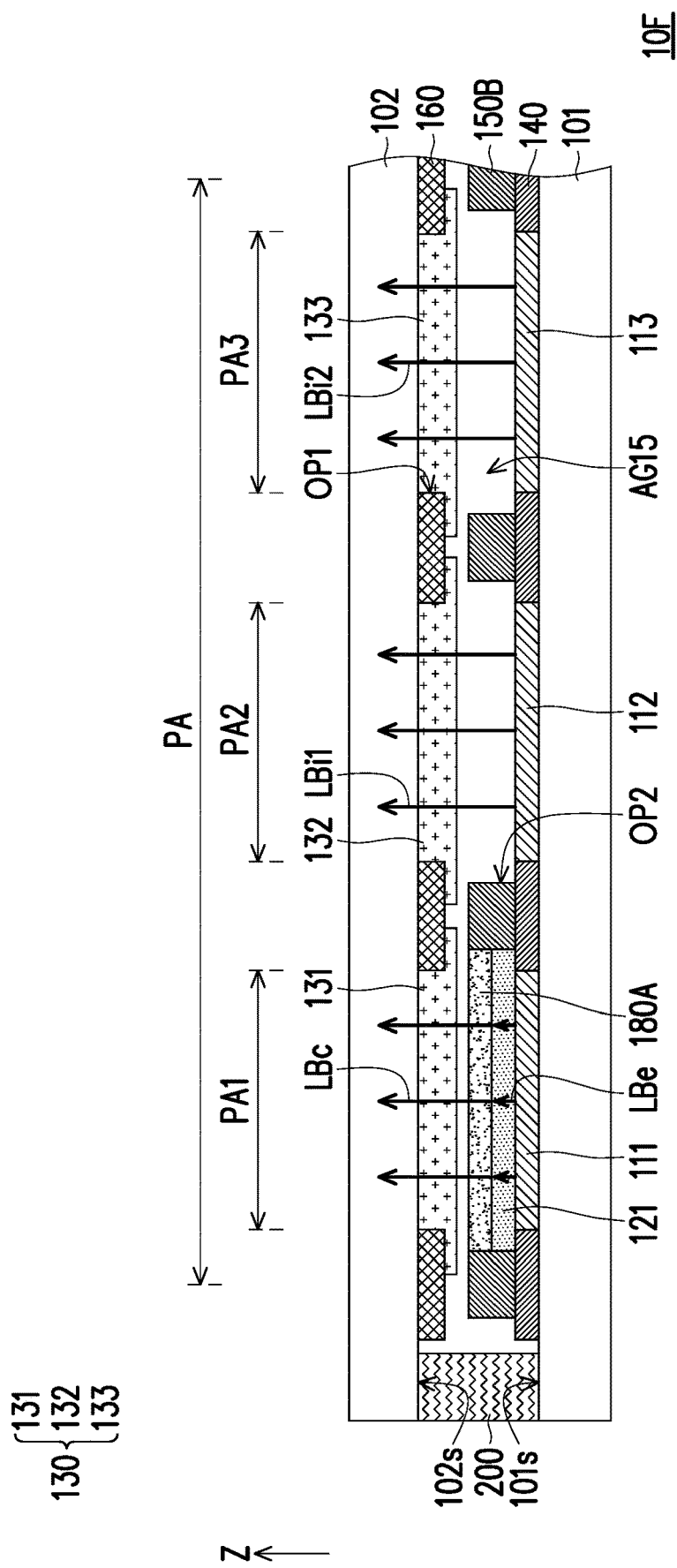
FIG. 7 is a schematic cross-sectional view of a micro light-emitting diode display panel of the sixth embodiment of the invention.

FIG. 6 is a schematic cross-sectional view of a micro light-emitting diode display panel of the fifth embodiment of the invention. FIG. 7 is a schematic cross-sectional view of a micro light-emitting diode display panel of the sixth embodiment of the invention. Referring to FIG. 6, the difference between a micro light-emitting diode display panel 10E of the present embodiment and the micro light-emitting diode display panel 10 of FIG. 1 lies in that the micro light-emitting diode display panel 10E may also optionally include a dichroic filter 180 overlapped with the plurality of micro light-emitting diodes 111 and the plurality of wavelength conversion patterns 121.

In the present embodiment, the dichroic filter 180 may be located between the wavelength conversion patterns 121 (or wavelength conversion layer) and the micro light-emitting diodes 111. That is, the dichroic filter 180 may be disposed in a portion of the second openings OP2 of the isolation layer 150B. It is particularly noted that the dichroic filter 180 is adapted to reflect the converted light beam LBc from the wavelength conversion patterns 121 and increase the pass rate of the light beam LBe from the micro light-emitting diodes 111. Therefore, the conversion efficiency of the light beam LBe and the light output efficiency of the converted light beam LBc may be increased.

However, the invention is not limited thereto. In other embodiments, a dichroic filter 180A of a micro light-emitting diode display panel 10F may also be disposed between the wavelength conversion patterns 121 and the light filter patterns 131, as shown in FIG. 7. That is, the wavelength conversion patterns 121 are located between the micro light-emitting diodes 111 and the dichroic filter 180A. Different from the micro light-emitting diode display panel 10E of FIG. 6, the dichroic filter 180A of the micro light-emitting diode display panel 10F is adapted to reflect the light beam LBe from the micro light-emitting diodes 111 and increase the pass rate of the converted light beam LBc from the wavelength conversion patterns 121. Therefore, the wavelength conversion efficiency of the light beam LBe and the light output efficiency of the converted light beam LBc may be increased.

Figure 8:
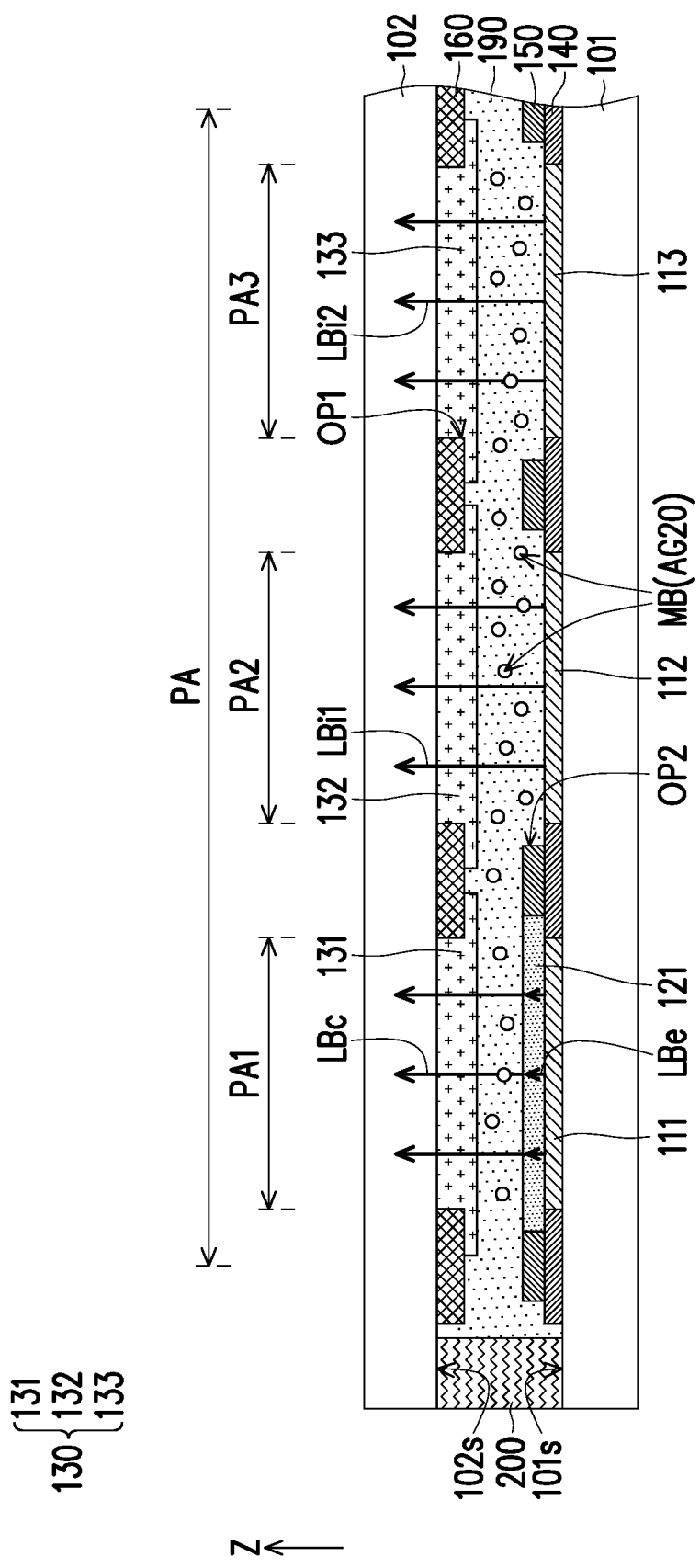
FIG. 8 is a schematic cross-sectional view of a micro light-emitting diode display panel of the seventh embodiment of the invention.

FIG. 8 is a schematic cross-sectional view of a micro light-emitting diode display panel of the seventh embodiment of the invention. Referring to FIG. 8, the difference between a micro light-emitting diode display panel 20 of the present embodiment and the micro light-emitting diode display panel 10 of FIG. 1 lies in that the configuration of the air gap is different. Specifically, the micro light-emitting diode display panel 20 may also optionally include an optical adhesive layer 190, and the optical adhesive layer 190 is provided with a plurality of microbubbles MB. The microbubbles MB dispersed in the optical adhesive layer 190 form an air gap AG20 of the micro light-emitting diode display panel 20.

It should be mentioned that, the configuration of the optical adhesive layer 190 may ensure the stability of the pitch between the wavelength conversion layer (or micro light-emitting diodes) on the first substrate 101 and the light filter layer 130 on the second substrate 102 to further improve the display quality of the micro light-emitting diode display panel 20. Moreover, the effective refractive index of the optical adhesive layer 190 may be adjusted via the microbubbles MB, thereby reducing the light energy loss of the converted light beam LBc, the light beam LBi1, and the light beam LBi2 after passing through the optical adhesive layer 190 to increase the light output efficiency of the micro light-emitting diode display panel 20. In particular, the orthographic projection area of the microbubbles MB on the first substrate 101 is less than the orthographic projection area of each of the micro light-emitting diodes on the first substrate 101. The diameter of the microbubbles MB may be less than or equal to 1 micron (preferably less than or equal to 500 nanometers), thereby increasing the refractive index to facilitate light output.

Figure 9:
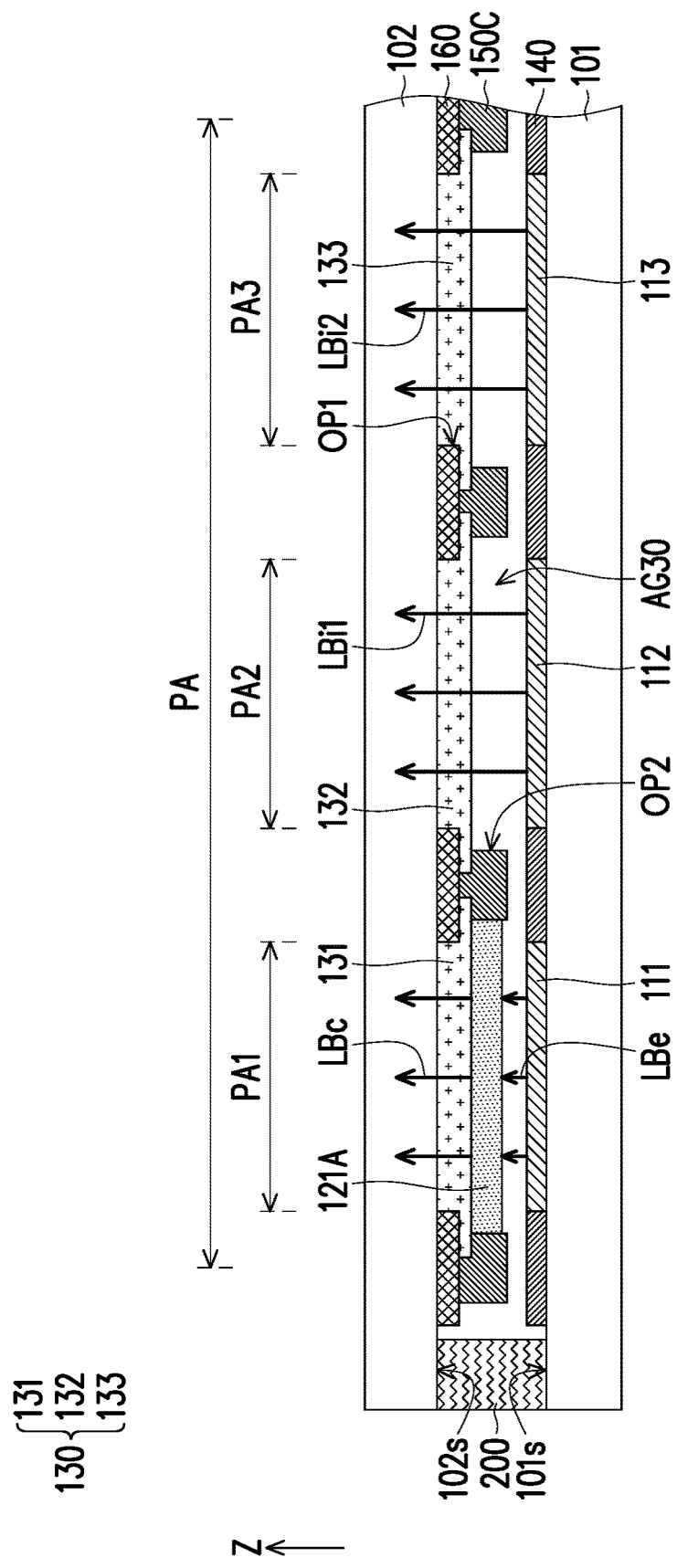
FIG. 9 is a schematic cross-sectional view of a micro light-emitting diode display panel of the eighth embodiment of the invention.

FIG. 9 is a schematic cross-sectional view of a micro light-emitting diode display panel of the eighth embodiment of the invention. Referring to FIG. 9, the difference between a micro light-emitting diode display panel 30 of the present embodiment and the micro light-emitting diode display panel 10 of FIG. 1 lies in that the configuration of the wavelength conversion layer and the isolation layer is different. Specifically, wavelength conversion patterns 121A and an isolation layer 150C of the micro light-emitting diode display panel 30 are disposed on the second substrate 102. In other words, the part of an air gap AG30 of the micro light-emitting diode display panel 30 in the sub-pixel areas PA1 is located between the wavelength conversion patterns 121A and the micro light-emitting diodes 111. Therefore, the wavelength conversion patterns 121A, the isolation layer 150C, and the light-shielding pattern layer 160 may be fabricated on the second substrate 102 at the same time to increase fabrication yield.

Figure 10:
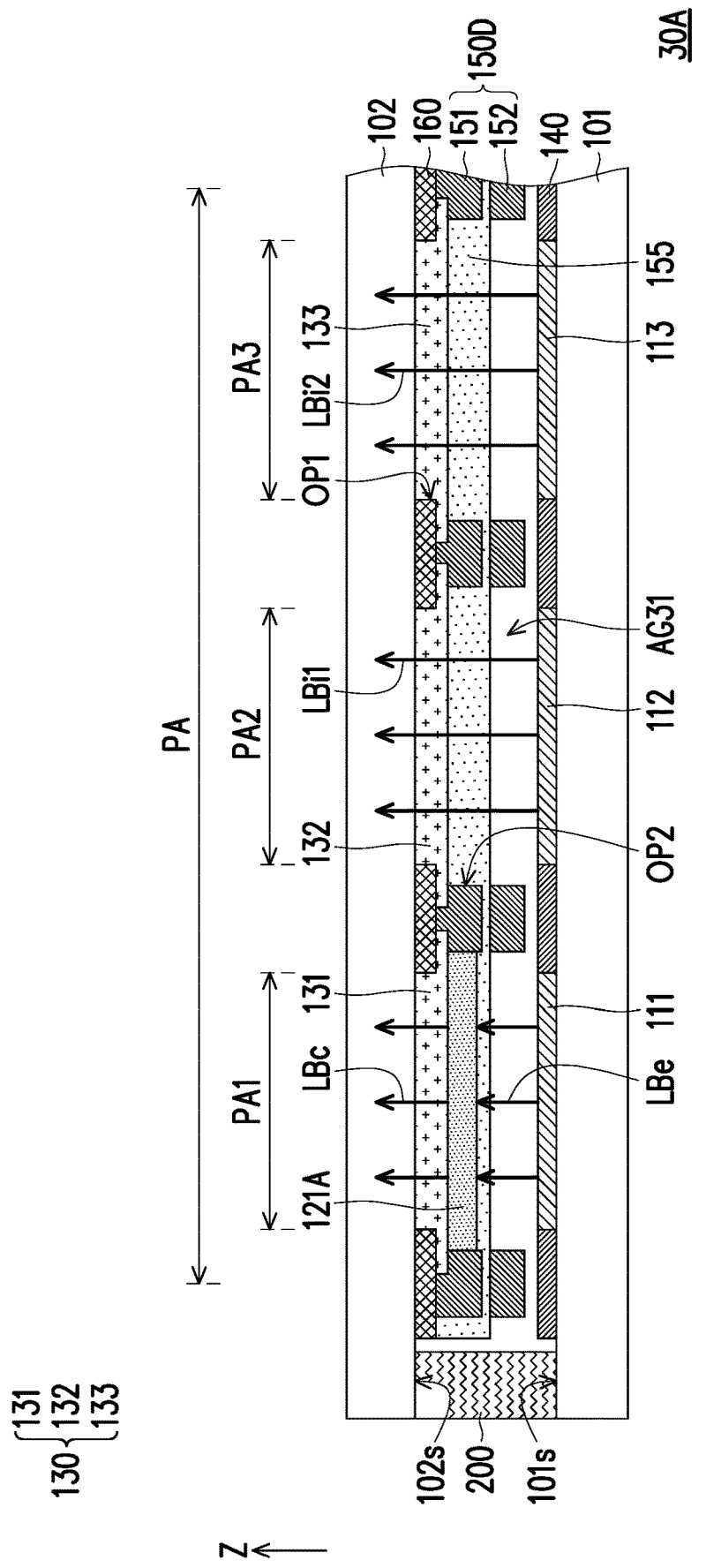
FIG. 10 is a schematic cross-sectional view of a micro light-emitting diode display panel of the ninth embodiment of the invention.

FIG. 10 is a schematic cross-sectional view of a micro light-emitting diode display panel of the ninth embodiment of the invention. Referring to FIG. 10, the main difference between a micro light-emitting diode display panel 30A of the present embodiment and the micro light-emitting diode display panel 30 of FIG. 9 lies in that the configuration of the isolation layer is different. In the present embodiment, an isolation layer 150D of the micro light-emitting diode display panel 30 is formed by two isolation sub-layers 151 and 152. A cladding layer 155 is provided between the isolation sub-layer 151 and the isolation sub-layer 152. The cladding layer 155 covers the isolation sub-layer 151, the wavelength conversion patterns 121, the second light filter patterns 132, and the third light filter patterns 133. The isolation sub-layer 152 is disposed on the isolation sub-layer 151 and is closer to the first substrate 101. The material of the cladding layer 155 may include a transmissive high-molecular-weight polymer, for example, polycarbonate, polyimide, polyethylene terephthalate, or epoxy.

In particular, the configuration of the isolation sub-layer 152 of the isolation layer 150D may avoid crosstalk between the light beams of adjacent sub-pixel areas, and the isolation layer 150D formed by stacking a plurality of sub-layers may have greater process flexibility. In the present embodiment, due to the configuration of the cladding layer 155, a selectivity of refractive index of the cladding layer 155 between the refractive indices of the air gap AG31 and the light filter patterns may be realized to increase the throughput of light beams, and a protection of light filter patterns may be provided, but is not limited thereto.

Figure 11:
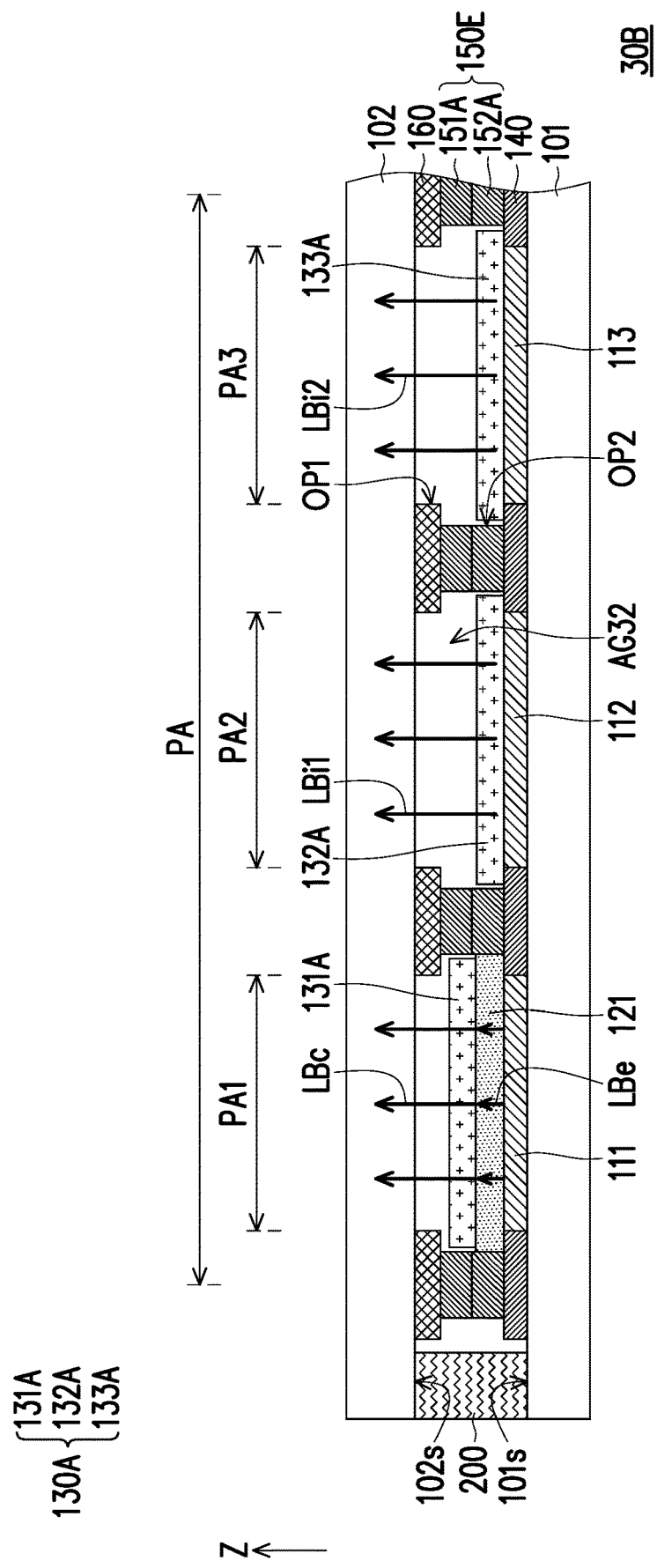
FIG. 11 is a schematic cross-sectional view of a micro light-emitting diode display panel of the tenth embodiment of the invention.

FIG. 11 is a schematic cross-sectional view of a micro light-emitting diode display panel of the tenth embodiment of the invention. Referring to FIG. 11, the main difference between a micro light-emitting diode display panel 30B of the present embodiment and the micro light-emitting diode display panel 30A of FIG. 10 lies in that the configuration of the light filter layer is different. In the present embodiment, the light filter layer 130A of the micro light-emitting diode display panel 30B, such as the light filter patterns 131A, the light filter patterns 132A, and the light filter patterns 133A, are disposed on the first substrate 101. Therefore, an air gap AG32 of the micro light-emitting diode display panel 30B is located between the second substrate 102 and the light filter patterns, and the light filter patterns 131A are directly disposed on the wavelength conversion patterns 121, so that the converted light beam LBc may directly enter the light filter patterns 131A to increase light filtering efficiency.

Moreover, in the present embodiment, an isolation sub-layer 151A and an isolation sub-layer 152A of an isolation layer 150E are fabricated on the second substrate 102 and the first substrate 101, respectively. After the two substrates are assembled, the isolation sub-layer 151A and the isolation sub-layer 152A are connected to each other to form the isolation layer 150E. Via the configuration of the isolation layer 150E, crosstalk between the light beams of adjacent sub-pixel areas may be avoided, so as to further improve the display quality of the micro light-emitting diode display panel 30B.

Figure 12:
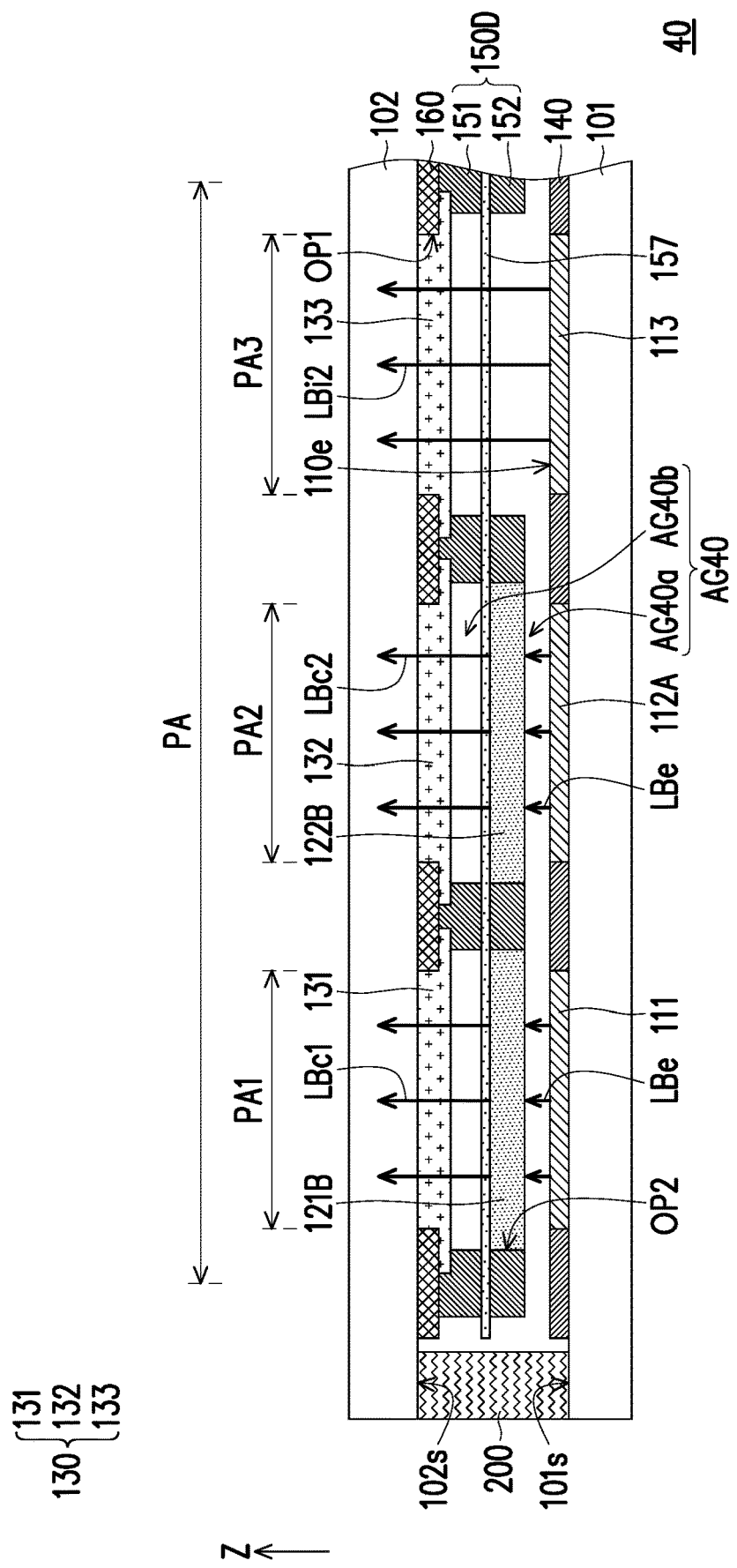
FIG. 12 is a schematic cross-sectional view of a micro light-emitting diode display panel of the eleventh embodiment of the invention.

FIG. 12 is a schematic cross-sectional view of a micro light-emitting diode display panel of the eleventh embodiment of the invention. Referring to FIG. 12, the difference between a micro light-emitting diode display panel 40 of the present embodiment and the micro light-emitting diode display panel 30A of FIG. 10 lies in that the configuration of the air gap is different. Specifically, an air gap AG40 of the micro light-emitting diode display panel 40 includes a first sub-gap layer AG40$a$ and a second sub-gap layer AG40$b$. The first sub-gap layer AG40$a$ is disposed between the light filter layer 130 and the wavelength conversion layer, and the second sub-gap layer AG40$b$ is disposed between the wavelength conversion layer and the micro light-emitting diodes.

For example, in the present embodiment, the wavelength conversion layer of the micro light-emitting diode display panel 40 may include wavelength conversion patterns 121B and wavelength conversion patterns 122B. A light-transmitting layer 157 is further provided between the isolation sub-layer 151 and the isolation sub-layer 152, and the wavelength conversion patterns are disposed on the light-transmitting layer 157. The material of the light-transmitting layer 157 may include an optical adhesive material, a polymer (for example, polycarbonate, polyimide, or polyethylene terephthalate), or other materials having suitable hardness. It should be noted that the light-transmitting layer 157, the isolation sub-layer 151, and the light filter layer 130 may define the second sub-gap layer AG40$b$ of the air gap AG40. A portion of the light-transmitting layer 157, the reflective layer 140, a light-emitting surface 110$e$ of each of the micro light-emitting diodes, and the isolation sub-layer 152 may define the first sub-gap layer AG40$a$ of the air gap AG40.

It should be mentioned that, in order to avoid crosstalk between the light beams of adjacent sub-pixel areas, the height of each of the sub-gap layers of the air gap AG40 in each of the sub-pixel areas is less than the arrangement pitch of the plurality of micro light-emitting diodes on the first substrate 101, but is not limited thereto. The configuration relationship of other members of the micro light-emitting diode display panel 40 and the technical effects thereof are similar to those of the micro light-emitting diode display panel 10A of FIG. 2. Therefore, for a detailed description, please refer to the relevant paragraphs of the above embodiment, which is not repeated herein.

Figure 13:
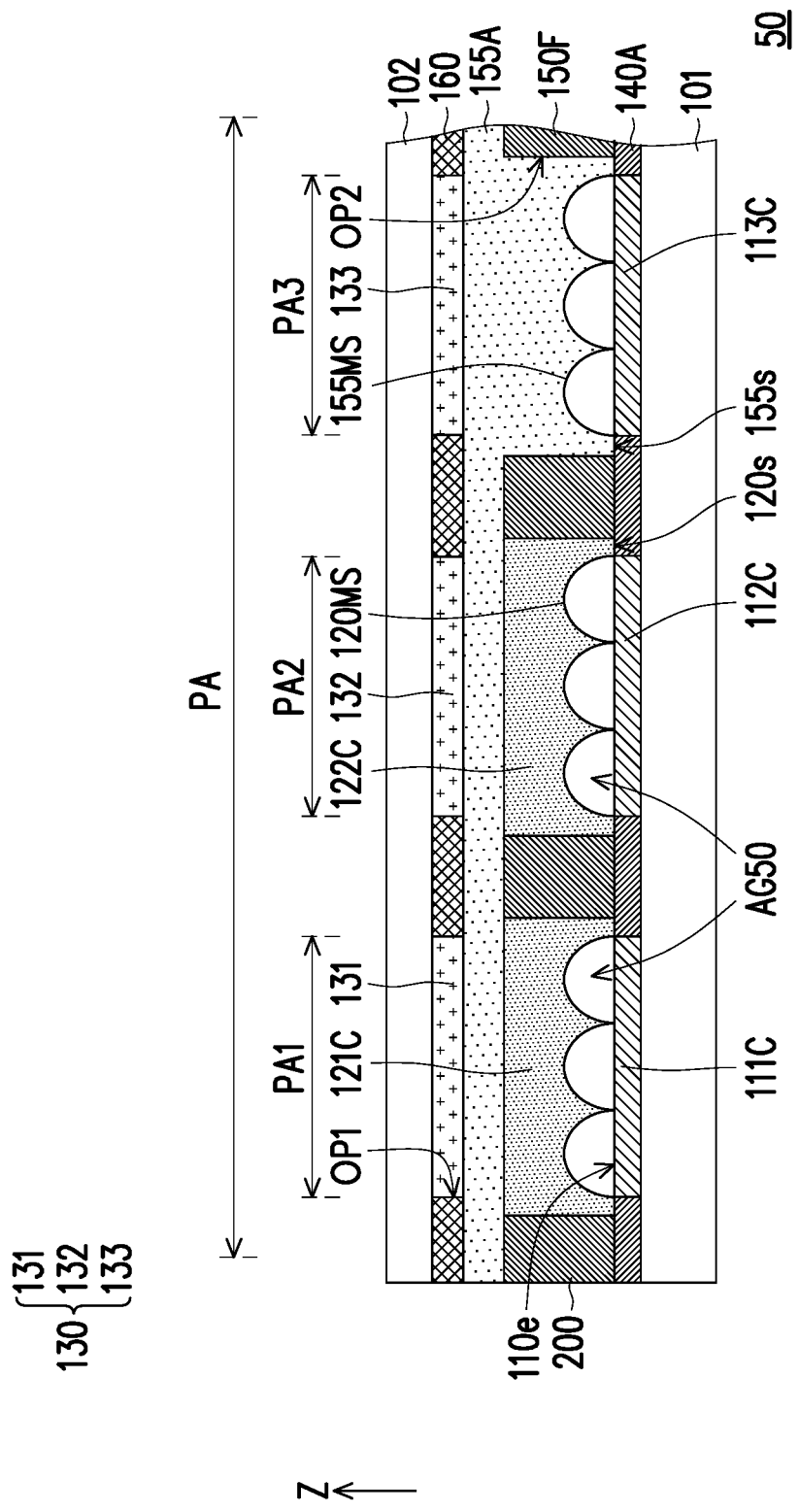
FIG. 13 is a schematic cross-sectional view of a micro light-emitting diode display panel of the twelfth embodiment of the invention.

FIG. 13 is a schematic cross-sectional view of a micro light-emitting diode display panel of the twelfth embodiment of the invention. Referring to FIG. 13, the main difference between a micro light-emitting diode display panel 50 of the present embodiment and the micro light-emitting diode display panel 10A of FIG. 2 lies in that an air gap AG50 of the micro light-emitting diode display panel 50 is disposed between the plurality of micro light-emitting diodes and the wavelength conversion layer.

In the present embodiment, the wavelength conversion layer (i.e., wavelength conversion patterns 121C and wavelength conversion patterns 122C) is provided with a plurality of optical microstructures 120MS on a surface 120$s$ facing the micro light-emitting diodes, and the light-emitting surface 110$e$ of micro light-emitting diodes 111C and micro light-emitting diodes 112C and the wavelength conversion layer define the surface 120$s$ of the optical microstructures 120MS to define a portion of the air gap AG50 of the micro light-emitting diode display panel 50. Moreover, the micro light-emitting diode display panel 50 may further include a cladding layer 155A. The cladding layer 155A covers an isolation layer 150F and the wavelength conversion layer, and is filled in the plurality of second openings OP2 of the isolation layer 150F overlapped with a plurality of micro light-emitting diodes 113C.

It should be mentioned that, a surface 155s of the portion of the cladding layer 155A filled in the second openings OP2 facing the micro light-emitting diodes 113C is also provided with a plurality of optical microstructures 155MS. The light-emitting surface 110e of the micro light-emitting diodes 112C and the surface 155s of the cladding layer 155A defining the optical microstructures 155MS define another portion of the air gap AG50 of the micro light-emitting diode display panel 50.

In the present embodiment, the light-emitting surface 110e of the micro light-emitting diodes is provided with the air gap AG50, and the air gap AG50 is, for example, a combination of a plurality of air lenses. Therefore, the refraction effect of the air lenses may increase the wavelength conversion efficiency of the light beams from the micro light-emitting diodes 111C and the micro light-emitting diodes 112C in the wavelength conversion layer, and may adjust the optical shape of the light beams from the micro light-emitting diodes 113C to improve display effect.

Figure 14:
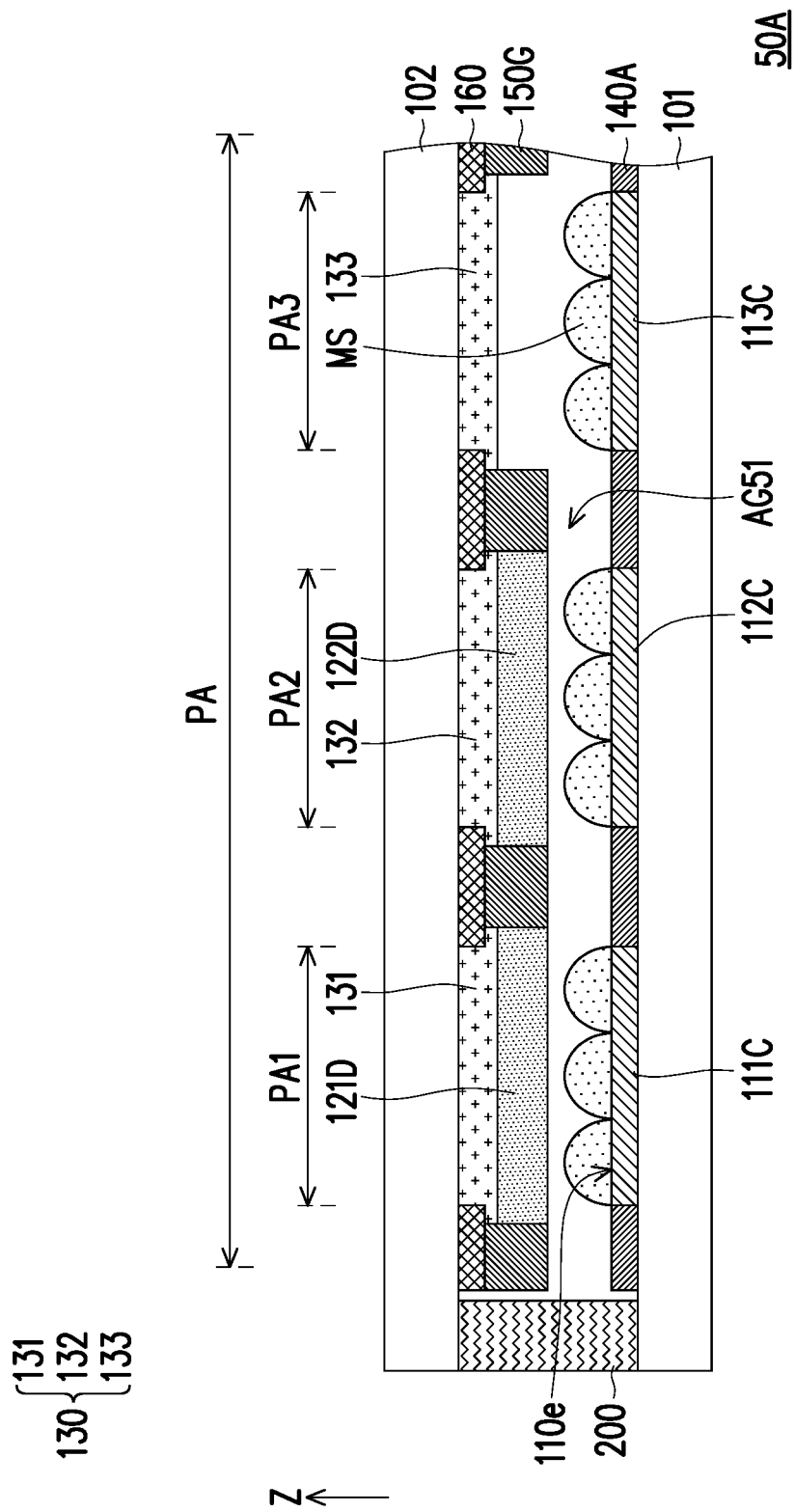
FIG. 14 is a schematic cross-sectional view of a micro light-emitting diode display panel of the thirteenth embodiment of the invention.

FIG. 14 is a schematic cross-sectional view of a micro light-emitting diode display panel of the thirteenth embodiment of the invention. Referring to FIG. 14, the difference between a micro light-emitting diode display panel 50A of the present embodiment and the micro light-emitting diode display panel 50 of FIG. 13 lies in that the wavelength conversion layer (that is, wavelength conversion patterns 121D and wavelength conversion patterns 122D) and an isolation layer 150G of the micro light-emitting diode display panel 50A are disposed on the second substrate 102.

Moreover, in the present embodiment, the plurality of optical microstructures MS provided on the light-emitting surface 110e of the micro light-emitting diodes may be a plurality of physical microlenses, and the surface of the optical microstructures MS, the reflective layer 140A, the isolation layer 150G, the wavelength conversion patterns 121D, the wavelength conversion patterns 122D, and the light filter patterns 133 may define an air gap AG51 of the micro light-emitting diode display panel 50A. In other words, the air gap AG51 of the present embodiment is disposed between the plurality of optical microstructures MS and the wavelength conversion layer.

Via the configuration of the optical microstructures MS, the optical shape of the light beams from the micro light-emitting diodes 111C and the micro light-emitting diodes 112C may be concentrated, thereby increasing the wavelength conversion efficiency of the light beams when passing through the wavelength conversion layer. In addition, the optical shape of the light beam from the micro light-emitting diodes 113C may also be adjusted to improve display effect.

Figure 15:
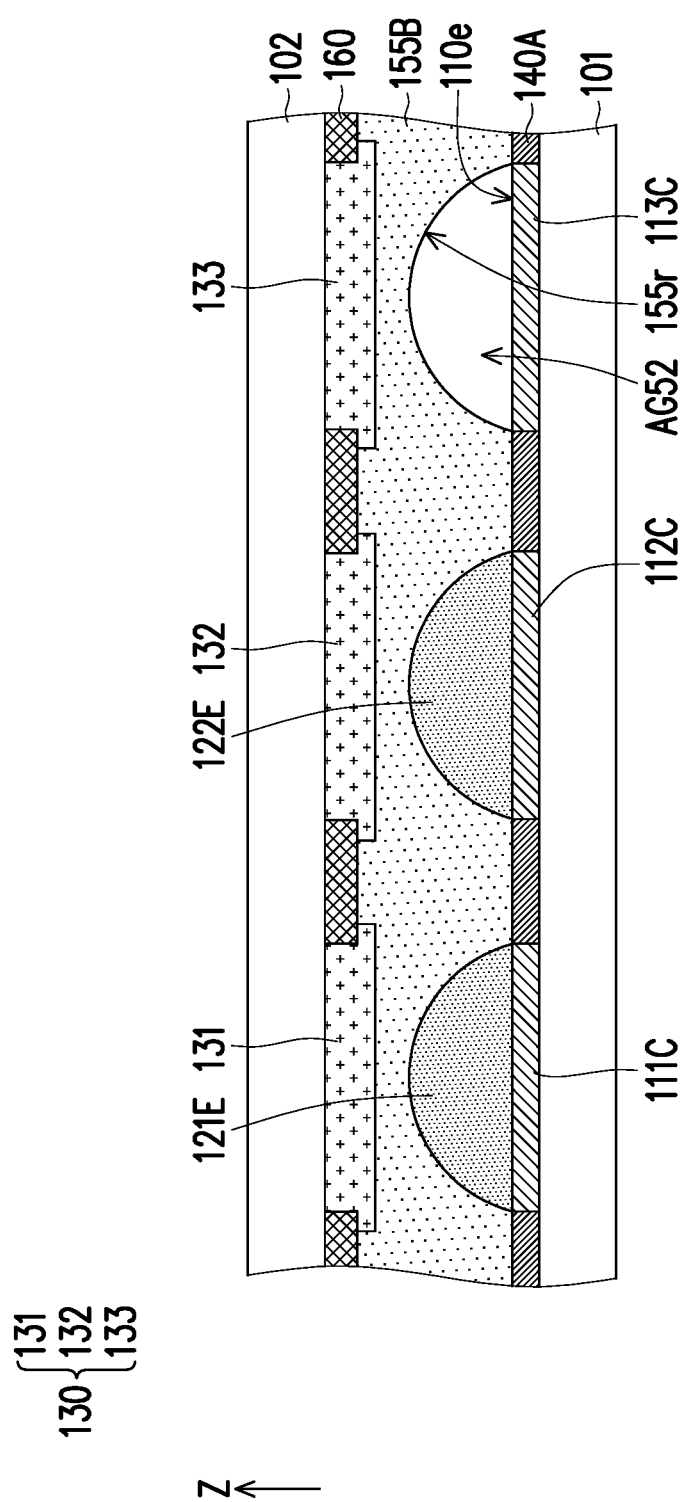
FIG. 15 is a schematic cross-sectional view of a micro light-emitting diode display panel of the fourteenth embodiment of the invention.

FIG. 15 is a schematic cross-sectional view of a micro light-emitting diode display panel of the fourteenth embodiment of the invention. Referring to FIG. 15, the main difference between a micro light-emitting diode display panel 50B of the present embodiment and the micro light-emitting diode display panel 50 of FIG. 13 lies in that the structures of the wavelength conversion layer and the cladding layer are different. Specifically, the cross-sectional profile of wavelength conversion patterns 121E and wavelength conversion patterns 122E of the micro light-emitting diode display panel 50B is similar to a convex lens. The cross section here is, for example, the drawing section of FIG. 15.

From another perspective, in the present embodiment, a cladding layer 155B has a plurality of grooves 155r overlapped with a plurality of micro light-emitting diodes, and the surface profile of the cladding layer 155B defining the grooves 155r is arc-shaped. The wavelength conversion patterns 121E and the wavelength conversion patterns 122E are disposed in a portion of the grooves 155r, and another portion of the grooves 155r without the wavelength conversion layer and the light-emitting surface 110e of the micro light-emitting diodes 113C may define an air gap AG52 of the micro light-emitting diode display panel 50B.

Since the cladding layer 155B defines the surface of the grooves 155r to have a refractive effect, the light beam patterns from the micro light-emitting diodes 111C and the micro light-emitting diodes 112C may be increased, thus further increasing the wavelength conversion efficiency of the light beams when passing through the wavelength conversion layer. In addition, the optical shape of the light beam from the micro light-emitting diodes 113C may also be adjusted to improve display effect.

Figure 16:
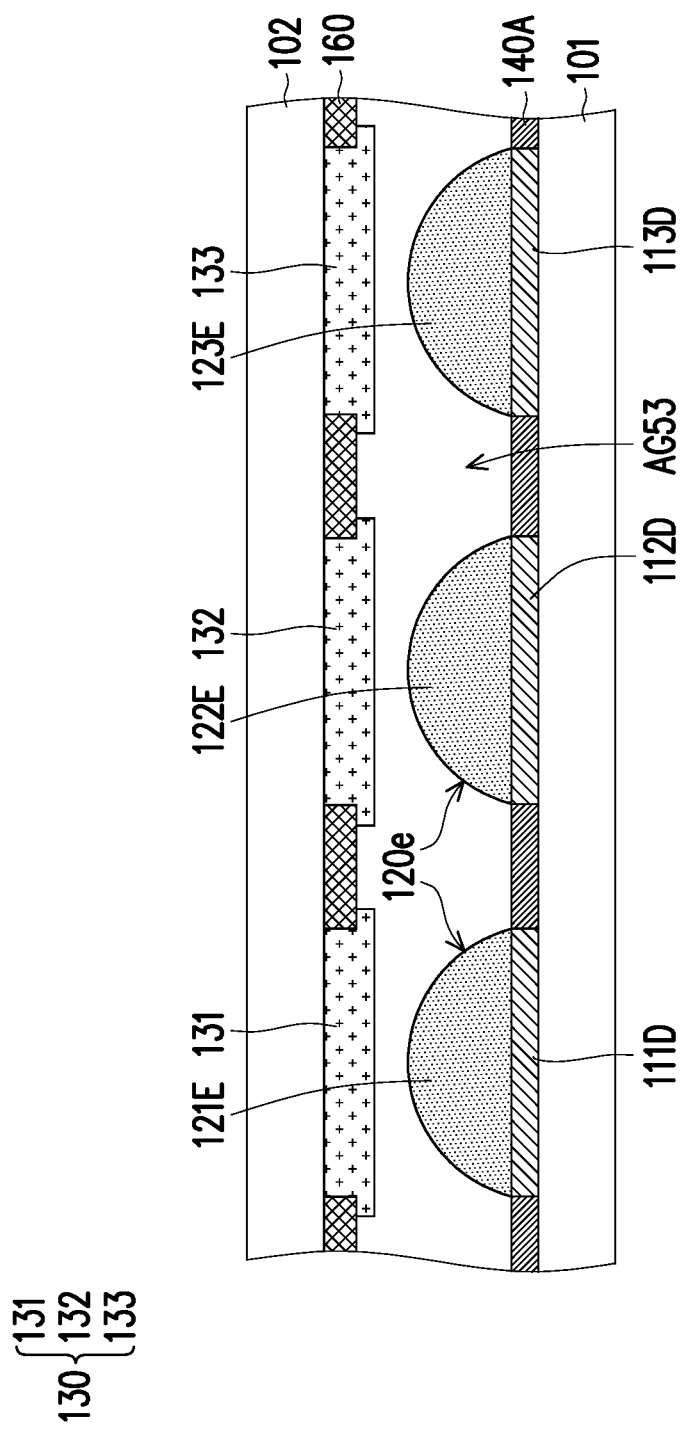
FIG. 16 is a schematic cross-sectional view of a micro light-emitting diode display panel of the fifteenth embodiment of the invention.

FIG. 16 is a schematic cross-sectional view of a micro light-emitting diode display panel of the fifteenth embodiment of the invention. Referring to FIG. 16, the difference between a micro light-emitting diode display panel 50C of the present embodiment and the micro light-emitting diode display panel 50B of FIG. 15 lies in that the configuration of the air gap is different. Specifically, the wavelength conversion layer of the micro light-emitting diode display panel 50C includes a plurality of wavelength conversion patterns 121E, a plurality of wavelength conversion patterns 122E, and a plurality of wavelength conversion patterns 123E. Micro light-emitting diodes 111D, micro light-emitting diodes 112D, and micro light-emitting diodes 113D respectively overlapped with the wavelength conversion patterns are all adapted to emit ultraviolet light, for example. Moreover, the ultraviolet light is used to excite the wavelength conversion patterns 121E, the wavelength conversion patterns 122E, and the wavelength conversion patterns 123E to respectively emit red light, green light, and blue light, but is not limited thereto. In an embodiment not shown, according to actual optical design or application requirements, the wavelength conversion patterns 123E are not disposed on the micro light-emitting diodes 113D as in the above embodiment.

In the present embodiment, an air gap AG53 is disposed between the light filter layer 130 and the wavelength conversion layer, and the profile of a surface 120e of a plurality of wavelength conversion patterns defining the air gap AG53 is arc-shaped. In other words, the cross-sectional profile of the wavelength conversion patterns resembles a convex lens. The cross section here is, for example, the drawing section of FIG. 16. Since the surface 120e of the wavelength conversion patterns defining the air gap AG53 has a refraction effect, the surface 120e may be used to adjust the optical shape of the converted light beam from the wavelength conversion patterns to increase the light output efficiency of the converted light beam after passing through the light filter layer 130.

Figure 17:
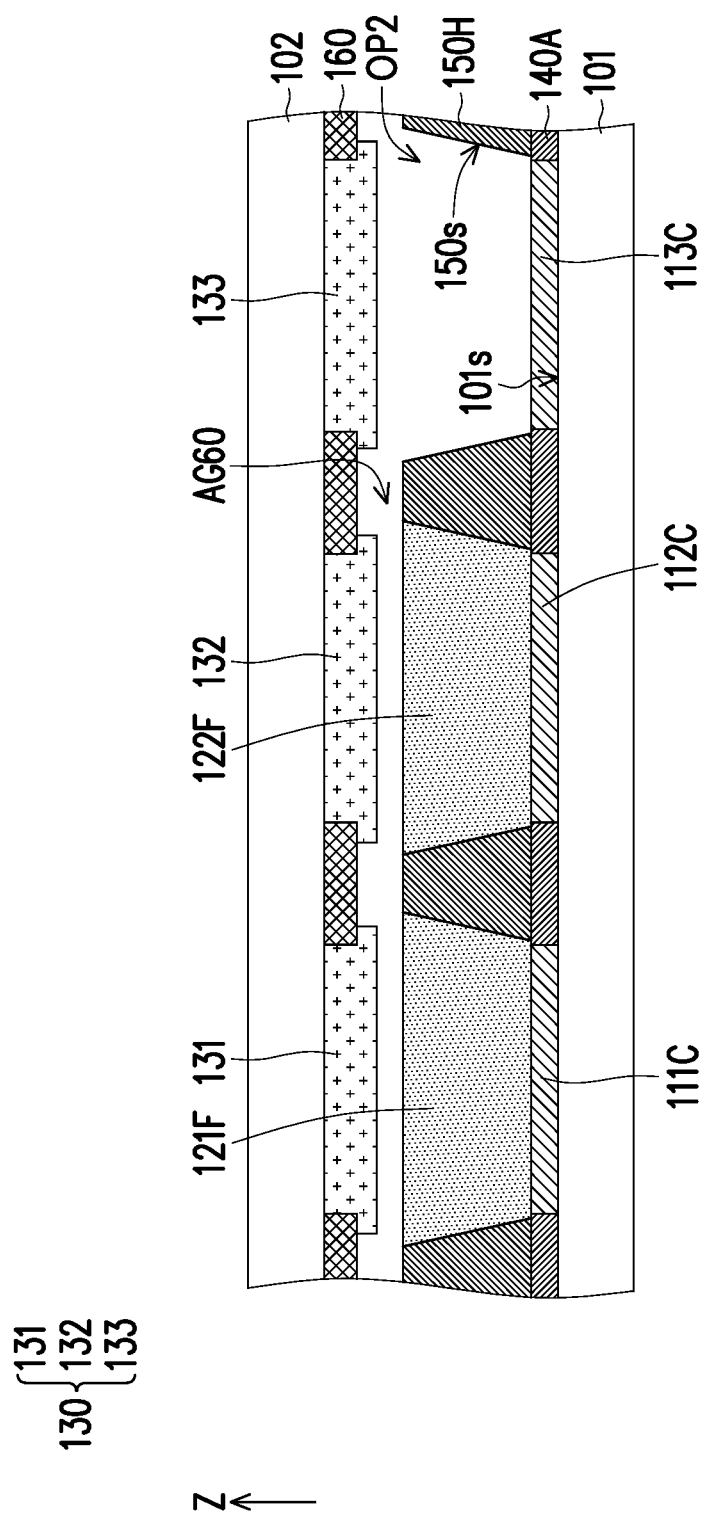
FIG. 17 is a schematic cross-sectional view of a micro light-emitting diode display panel of the sixteenth embodiment of the invention.

FIG. 17 is a schematic cross-sectional view of a micro light-emitting diode display panel of the sixteenth embodiment of the invention. Referring to FIG. 17, the main difference between a micro light-emitting diode display panel 60 of the present embodiment and the micro light-emitting diode display panel 10A of FIG. 2 lies in that the configuration of the isolation layer is different. Specifically, a surface 150s of an isolation layer 150H of the micro light-emitting diode display panel 60 defining the second openings OP2 is inclined to the substrate surface 101s of the first substrate 101. The isolation layer 150H, for example, is a trapezoid structure, but is not limited thereto. Accordingly, the optical shape (for example, light collection) of the converted light beam from the wavelength conversion patterns and the light beam from the micro light-emitting diodes 113C may be adjusted to increase light output display efficiency.

Figure 18A:
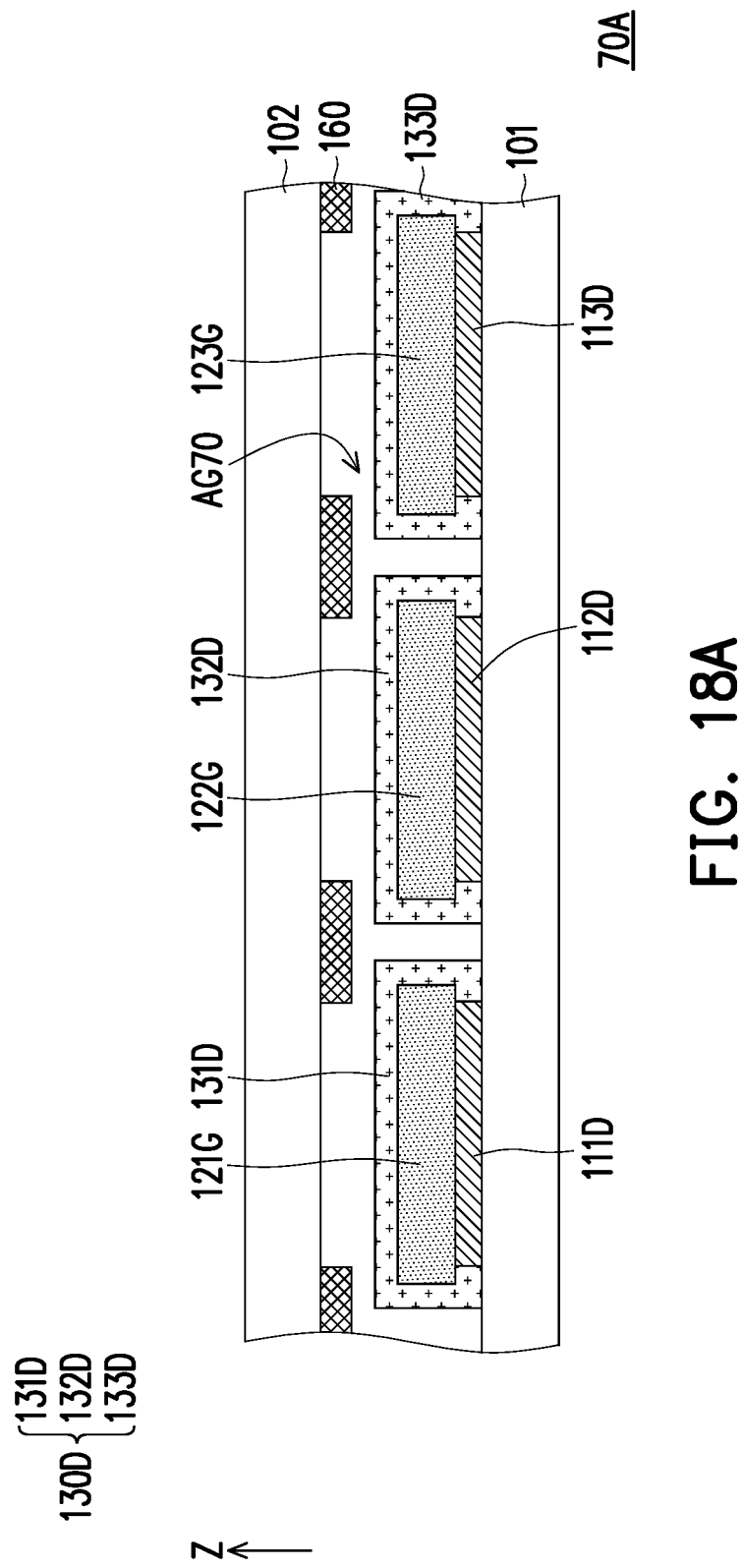
FIG. 18A is a schematic cross-sectional view of a micro light-emitting diode display panel of the seventeenth embodiment of the invention.
Figure 18B:
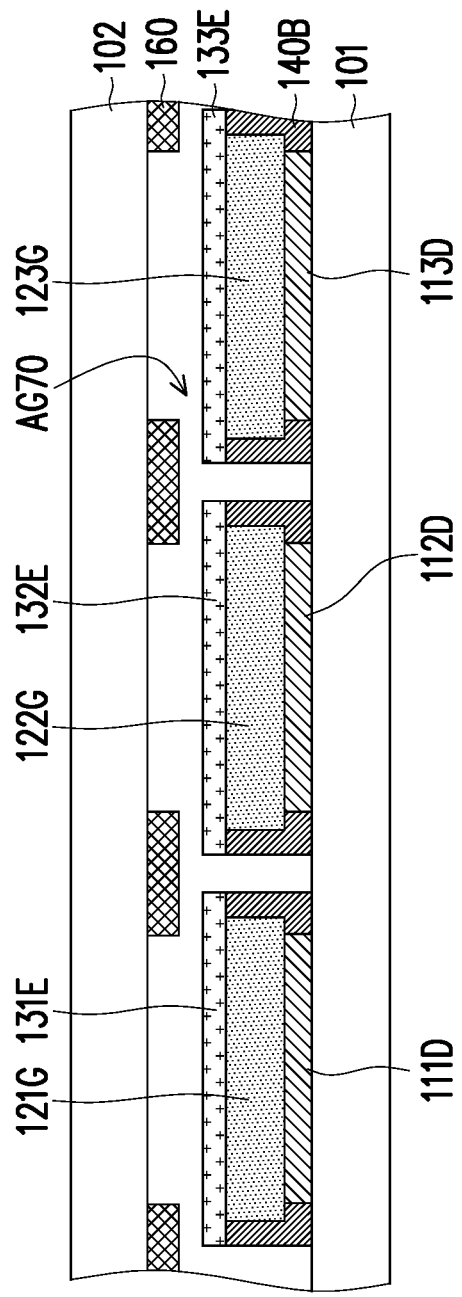
FIG. 18B is a schematic cross-sectional view of another modified embodiment of the micro light-emitting diode of FIG. 18A.

FIG. 18A is a schematic cross-sectional view of a micro light-emitting diode display panel of the seventeenth embodiment of the invention. FIG. 18B is a schematic cross-sectional view of another modified embodiment of the micro light-emitting diode of FIG. 18A. Referring to FIG. 18A, the main difference between a micro light-emitting diode display panel 70A of the present embodiment and the micro light-emitting diode display panel 30B of FIG. 11 lies in that the configuration of the wavelength conversion layer and the light filter layer is different. In the present embodiment, the micro light-emitting diodes and the wavelength conversion patterns of the micro light-emitting diode display panel 70A are covered by the light filter layer 130D. More specifically, the micro light-emitting diodes, the wavelength conversion patterns, and the light filter patterns stacked on each other may form one packaging unit.

For example, in the present embodiment, the micro light-emitting diode display panel 70A may have three types of packaging units, wherein the first type of packaging unit is formed by the micro light-emitting diodes 111D, a wavelength conversion pattern 121G, and light filter patterns 131D. The second type of packaging unit is formed by the micro light-emitting diodes 112D, wavelength conversion patterns 122G, and light filter patterns 132D. The third type of packaging unit is formed by the micro light-emitting diodes 113D, wavelength conversion patterns 123G, and light filter patterns 133D. The optical design of the plurality of micro light-emitting diodes, the plurality of wavelength conversion patterns, and the plurality of light filter patterns of the present embodiment is similar to that of the micro light-emitting diode display panel 50C of FIG. 16. Therefore, for a detailed description, please refer to the relevant paragraphs of the above embodiment, which is not repeated herein.

It should be mentioned that, in other embodiments, the composition of the packaging units may be adjusted according to different optical designs. For example, the luminous wavelength of the micro light-emitting diodes of the third type of packaging unit is different from the luminous wavelengths of the micro light-emitting diodes of the other two packaging units. Therefore, the third type of packaging unit is not provided with the wavelength conversion patterns 123G. That is to say, the third type of packaging unit may be formed by micro light-emitting diodes and light filter patterns.

Referring to FIG. 18B, in another embodiment, the packaging unit of a micro light-emitting diode display panel 70B may also optionally include a reflective layer 140B. The reflective layer 140B covers the sidewalls of the micro light-emitting diodes and the wavelength conversion patterns to increase the light output efficiency of the micro light-emitting diodes and the wavelength conversion efficiency of the wavelength conversion patterns. Therefore, the light filter patterns (for example, the light filter patterns 131E to 133E) do not cover the micro light-emitting diodes and the wavelength conversion patterns as in the packaging unit shown in FIG. 18A.

It should be noted that an air gap AG70 of FIG. 18A and FIG. 18B is disposed between the second substrate 102 (or the light-shielding pattern layer 160) and the plurality of packaging units. The configuration of the air gap AG70 may prevent the light output intensity of the micro light-emitting diodes from being lost due to the packaging adhesive layer filled between the two substrates. In other words, the micro light-emitting diode display panel 70A and the micro light-emitting diode display panel 70B provided with the air gap AG70 have better light output efficiency than a conventional micro light-emitting diode display panel provided with an encapsulation layer.

Figure 19:
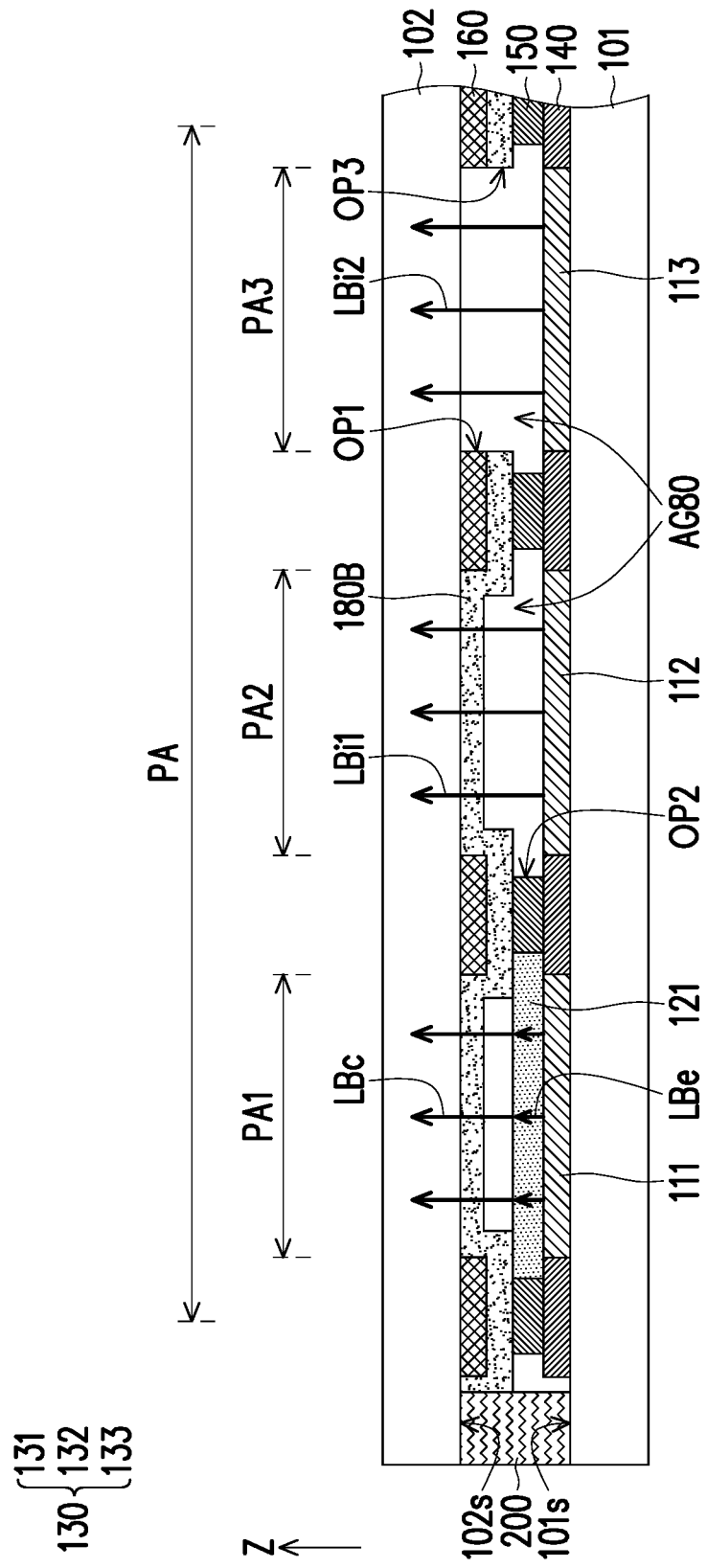
FIG. 19 is a schematic cross-sectional view of a micro light-emitting diode display panel of the eighteenth embodiment of the invention.

FIG. 19 is a schematic cross-sectional view of a micro light-emitting diode display panel of the eighteenth embodiment of the invention. Referring to FIG. 19, the difference between a micro light-emitting diode display panel 80 of the present embodiment and the micro light-emitting diode display panel 10 of FIG. 1 lies in that the micro light-emitting diode display panel 80 uses a dichroic filter 180B to replace the light filter layer 130 (that is, the light filter patterns 131 to 133) of FIG. 1. That is, the function of the dichroic filter 180B on the micro light-emitting diode display panel 80 is similar to that of the light filter layer 130 of FIG. 1.

In the present embodiment, the dichroic filter 180B is adapted to reflect the light beam LBe from the micro light-emitting diodes 111 and allow the converted light beam LBc from the wavelength conversion patterns 121 and the light beam LBi1 from the micro light-emitting diodes 112 to pass through. It should be noted that, since the light beam LBi2 emitted by the micro light-emitting diodes 113 has the same wavelength as the light beam LBe, in order to reduce the occurrence of the light beam LBi2 being reflected by the dichroic filter 180B back to the air gap AG80, the dichroic filter 180B needs to have a plurality of openings OP3 overlapped with the plurality of micro light-emitting diodes 113. The openings OP3 are adapted to allow the light beam LBi2 from the micro light-emitting diodes 113 pass through.

Based on the above, in the micro light-emitting diode display panel of an embodiment of the invention, a plurality of micro light-emitting diodes, a light-shielding pattern layer, a wavelength conversion layer, and a light filter layer are provided between the first substrate and the second substrate. By disposing an air gap between any two adjacent ones of the micro light-emitting diodes, the wavelength conversion layer, the light filter layer, and the light-shielding pattern layer, the light output efficiency of the micro light-emitting diode display panel may be effectively increased. Moreover, the light-shielding pattern layer on the second substrate may also reduce the reflectivity of the micro light-emitting diode display panel to external ambient light, so as to increase the display contrast of the micro light-emitting diode display panel.

What is claimed is:

1. A micro light-emitting diode display panel, comprising:
a first substrate;
a second substrate disposed opposite to the first substrate;
a plurality of micro light-emitting diodes disposed on the first substrate and respectively located in a plurality of sub-pixel areas, and the micro light-emitting diodes are adapted to emit a light beam;
a wavelength conversion layer overlapped with at least a portion of the micro light-emitting diodes and located between the at least a portion of the micro light-emitting diodes and the second substrate, wherein the light beam is used to excite the wavelength conversion layer to emit a converted light beam;
a light-shielding pattern layer disposed on the second substrate and having a plurality of first openings defining the sub-pixel areas;
a light filter layer disposed between the wavelength conversion layer and the second substrate and overlapped with the micro light-emitting diodes; and
an air gap disposed between any two adjacent ones of any one of the micro light-emitting diodes, the second substrate, the wavelength conversion layer, and the light filter layer.

2. The micro light-emitting diode display panel of claim 1, wherein a portion of the air gap located in a portion of the sub-pixel areas has a first height, another portion of the air gap located in another portion of the sub-pixel areas has a second height, and the first height is different from the second height.

3. The micro light-emitting diode display panel of claim 1, wherein the wavelength conversion layer is disposed on the first substrate, and the air gap is located between the wavelength conversion layer and the light filter layer.

4. The micro light-emitting diode display panel of claim 1, further comprising:
a dichroic filter overlapped with the at least a portion of the micro light-emitting diodes, wherein the dichroic filter is adapted to reflect one of the light beam and the converted light beam and allow the other one of the light beam and the converted light beam to pass through.

5. The micro light-emitting diode display panel of claim 1, wherein the wavelength conversion layer has a plurality of wavelength conversion patterns overlapped with the micro light-emitting diodes, and a surface profile of each of the wavelength conversion patterns defining the air gap is arc-shaped.

6. The micro light-emitting diode display panel of claim 1, wherein the wavelength conversion layer is disposed on the second substrate, and the air gap is located between the wavelength conversion layer and the micro light-emitting diodes.

7. The micro light-emitting diode display panel of claim 1, wherein the light filter layer is disposed on the first substrate, and the air gap is located between the second substrate and the light filter layer.

8. The micro light-emitting diode display panel of claim 1, wherein the air gap comprises a first sub-gap layer and a second sub-gap layer, the first sub-gap layer is disposed between the light filter layer and the wavelength conversion layer, and the second sub-gap layer is disposed between the wavelength conversion layer and the micro light-emitting diodes.

9. The micro light-emitting diode display panel of claim 1, further comprising:
an isolation layer disposed on the first substrate and having a plurality of second openings overlapped with the first openings of the light-shielding pattern layer, wherein the wavelength conversion layer is disposed in at least a portion of the second openings, and the light filter layer is disposed in the first openings.

10. The micro light-emitting diode display panel of claim 9, wherein one of the isolation layer and the light-shielding pattern layer extends in the air gap and contacts the other one of the isolation layer and the light-shielding pattern layer.

11. The micro light-emitting diode display panel of claim 9, further comprising:
a reflective layer disposed between the micro light-emitting diodes and located between the isolation layer and the first substrate.

12. The micro light-emitting diode display panel of claim 1, wherein a height of the air gap is less than an arrangement pitch of the micro light-emitting diodes on the first substrate.

13. The micro light-emitting diode display panel of claim 1, further comprising:
an optical adhesive layer disposed between the first substrate and the second substrate and connected to the at least a portion of the micro light-emitting diodes, the wavelength conversion layer, and the light filter layer, wherein the air gap is a plurality of microbubbles, and the microbubbles are dispersedly disposed in the optical adhesive layer.

14. The micro light-emitting diode display panel of claim 13, wherein an orthographic projection area of each of the microbubbles on the first substrate is less than an orthographic projection area of each of the micro light-emitting diodes on the first substrate.

15. The micro light-emitting diode display panel of claim 1, wherein a surface of the wavelength conversion layer facing the micro light-emitting diodes is provided with a plurality of optical microstructures, and the surface of the wavelength conversion layer and a light-emitting surface of the micro light-emitting diodes define the air gap.

16. The micro light-emitting diode display panel of claim 1, wherein a light-emitting surface of each of the micro light-emitting diodes facing the light filter layer is provided with a plurality of optical microstructures, and the air gap is located between the optical microstructures and the wavelength conversion layer.

17. The micro light-emitting diode display panel of claim 1, further comprising:
a cladding layer covering the micro light-emitting diodes and having a plurality of grooves, wherein the grooves are respectively overlapped with the micro light-emitting diodes, the wavelength conversion layer is disposed in a portion of the grooves and connects a portion of the micro light-emitting diodes and the cladding layer, and a surface of another portion of the grooves and a light-emitting surface of another portion of the micro light-emitting diodes define the air gap.

* * * * *